United States Patent
Uwani et al.

(10) Patent No.: US 10,975,497 B2
(45) Date of Patent: Apr. 13, 2021

(54) LIGHT EMITTING DEVICE

(71) Applicants: TAMURA CORPORATION, Tokyo (JP); KOHA CO., LTD., Tokyo (JP)

(72) Inventors: Mikihiko Uwani, Tokyo (JP); Akira Ito, Tokyo (JP); Hiroyuki Sawano, Tokyo (JP); Kentaro Tone, Tokyo (JP); Hiroaki Sano, Tokyo (JP); Daisuke Inomata, Tokyo (JP); Kazuyuki Iizuka, Tokyo (JP)

(73) Assignees: Tamura Corporation, Tokyo (JP); Koha Co., Ltd., Tokyo (JP)

( * ) Notice: Subject to any disclaimer, the term of this patent is extended or adjusted under 35 U.S.C. 154(b) by 174 days.

(21) Appl. No.: 16/066,369

(22) PCT Filed: Dec. 27, 2016

(86) PCT No.: PCT/JP2016/088838
§ 371 (c)(1),
(2) Date: Jun. 27, 2018

(87) PCT Pub. No.: WO2017/115778
PCT Pub. Date: Jul. 6, 2017

(65) Prior Publication Data
US 2020/0200347 A1 Jun. 25, 2020

(30) Foreign Application Priority Data
Dec. 28, 2015 (JP) .............................. JP2015-257520

(51) Int. Cl.
*F21S 41/16* (2018.01)
*C30B 29/28* (2006.01)
(Continued)

(52) U.S. Cl.
CPC ................ *C30B 29/28* (2013.01); *F21K 9/64* (2016.08); *F21S 41/16* (2018.01); *F21S 41/176* (2018.01);
(Continued)

(58) Field of Classification Search
CPC .......... F21S 41/176; F21S 41/16; F21K 9/64; F21V 9/38; F21V 13/14; H01S 5/005; H01S 5/32341
See application file for complete search history.

(56) References Cited

U.S. PATENT DOCUMENTS 7,985,981 B2  7/2011 Hashimoto et al.
8,872,203 B2 10/2014 Nagahama et al.
(Continued)

FOREIGN PATENT DOCUMENTS

JP  2010-147183 A  7/2010
JP  2010-165834 A  7/2010
(Continued)

OTHER PUBLICATIONS

International Search Report dated Feb. 7, 2017 issued in PCT/JP2016/088838.
(Continued)

*Primary Examiner* — Anne M Hines
(74) *Attorney, Agent, or Firm* — Scully, Scott, Murphy & Presser, PC

(57) ABSTRACT

A light emitting device includes a laser diode that emits a blue light, and a wavelength conversion part that absorbs a part of light emitted from the laser diode and converts a wavelength thereof. The wavelength conversion part includes a YAG-based single crystal phosphor. Irradiance of light emitted from the laser diode and irradiated on the wavelength conversion part is not less than 80 W/mm$^2$.

12 Claims, 35 Drawing Sheets

(51) Int. Cl.

| | | |
|---|---|---|
| *F21S 41/176* | (2018.01) | |
| *F21V 9/38* | (2018.01) | |
| *F21V 13/14* | (2006.01) | |
| *F21K 9/64* | (2016.01) | |
| *H01S 5/00* | (2006.01) | |
| *H01S 5/323* | (2006.01) | |
| *F21S 41/365* | (2018.01) | |
| *F21Y 115/30* | (2016.01) | |

(52) U.S. Cl.
CPC ............... *F21V 9/38* (2018.02); *F21V 13/14* (2013.01); *H01S 5/005* (2013.01); *H01S 5/32341* (2013.01); *F21S 41/365* (2018.01); *F21Y 2115/30* (2016.08)

(56) References Cited

U.S. PATENT DOCUMENTS

| | | |
|---|---|---|
| 9,529,134 B2 | 12/2016 | Morizumi et al. |
| 9,551,474 B2 | 1/2017 | Nagao et al. |
| 9,605,201 B2 | 3/2017 | Yamaguchi |
| 9,634,216 B2 | 4/2017 | Inomata et al. |
| 2009/0003400 A1 | 1/2009 | Nagahama et al. |
| 2010/0148203 A1 | 6/2010 | Hashimoto et al. |
| 2012/0106184 A1 | 5/2012 | Kishimoto et al. |
| 2014/0016300 A1 | 1/2014 | Sato et al. |
| 2015/0009703 A1 | 1/2015 | Morizumi et al. |
| 2015/0184830 A1 | 7/2015 | Nagao |
| 2015/0219291 A1* | 8/2015 | Yamaguchi ............... F21V 9/32 362/259 |
| 2016/0043289 A1 | 2/2016 | Inomata et al. |
| 2016/0190418 A1 | 6/2016 | Inomata et al. |
| 2016/0240748 A1 | 8/2016 | Inomata et al. |
| 2017/0051883 A1* | 2/2017 | Raring ............... H01S 5/02248 |
| 2017/0063033 A1 | 3/2017 | Morizumi et al. |
| 2017/0179346 A1 | 6/2017 | Inomata et al. |
| 2017/0186923 A1 | 6/2017 | Inomata et al. |

FOREIGN PATENT DOCUMENTS

| | | |
|---|---|---|
| JP | 5083205 B2 | 11/2012 |
| JP | 2014-22472 A | 2/2014 |
| JP | 5620562 B1 | 11/2014 |
| JP | 2015-29034 A | 2/2015 |
| JP | 2015-81314 A | 4/2015 |
| JP | 2015-081347 A | 4/2015 |
| JP | 2015-149394 A | 8/2015 |
| WO | WO 2010/049875 A1 | 5/2010 |
| WO | 2012128384 A1 | 9/2012 |
| WO | WO 2014/203479 A1 | 12/2014 |
| WO | WO 2014/203484 A1 | 12/2014 |
| WO | WO 2015/020205 A1 | 2/2015 |
| WO | 2015/060254 A1 | 4/2015 |

OTHER PUBLICATIONS

Chinese Office Action dated Aug. 20, 2019 issued in Chinese Patent Application No. 201680076965.6.

Extended European Search Report dated Jul. 31, 2019 issued in European Patent Application No. 16 88 1753.4.

Villora, E.G. et al., "$\beta$-$Ga_2O_3$ and single-crystal phosphors for high-brightness white LEDs & LDs, and $\beta$-$Ga_2O_3$ potential for next generation of power devices", Proc. SPIE, (Mar. 8, 2014) V.8987, pp. 89871U-1 to 89871U-1.

Japanese Office Action dated Oct. 23, 2019 from related Japanese Patent Application No. 2015-257520 together with English language translation.

* cited by examiner

LIGHT EMITTING DEVICE

TECHNICAL FIELD

The invention relates to a light emitting device.

BACKGROUND ART

Conventionally, light emitting device having a laser element and a YAG (Yttrium Aluminium Garnet)—based phosphor capable of converting wavelength of light emitted from laser element is known (see, e.g., WO 2015/020205 A, JP 5083205 B and WO 2014/203484 A).

The YAG-based phosphor disclosed in WO 2015/020205 A is a plate-shaped single crystal phosphor.

The YAG-based phosphor disclosed in JP 5083205 B is phosphors bound by a binder which is an inorganic material such as glass. JP5083205 B also discloses a light emitting device structure in which light from a laser diode chip is condensed by a condensing lens and is then incident on the phosphor glass.

The YAG-based phosphor disclosed in WO 2014/203484 A is phosphor powder contained in a binder or a sintered phosphor such as phosphor ceramic. WO 2014/203484 A also discloses a light emitting device structure in which light from a laser diode is incident on the phosphor via a lens or incidence optics such as optical fiber.

In WO 2014/203484 A, it is also described that the incident power of the laser beam is 5 W and a diameter of a light guiding path, through which the laser beam passes as a parallel light, is 0.3 mm. Based on this description, it is considered that a spot size of the laser beam irradiated on the phosphor is about 0.3 mm and irradiance is about 70 W/mm².

CITATION LIST

Patent Literatures

WO 2015/020205 A
JP 5083205 B
WO 2014/203484 A

SUMMARY OF INVENTION

Technical Problem

It is an object of the invention to provide a high-brightness light emitting device which emits white light by means of a combination of a laser diode and a phosphor.

Solution to Problem

To achieve the above-mentioned object, an embodiment of the invention provides a light emitting device defined by [1] to [7] below.
 [1] A light emitting device, comprising:
  a laser diode that emits a blue light; and
  a wavelength conversion part that absorbs a part of light emitted from the laser diode and converts a wavelength thereof,
  wherein the wavelength conversion part comprises a YAG-based single crystal phosphor, and
  wherein irradiance of light emitted from the laser diode and irradiated on the wavelength conversion part is not less than 80 W/mm².
 [2] The light emitting device according to [1], further comprising a lens that condenses light emitted from the laser diode,
  wherein light condensed by the lens is irradiated on the wavelength conversion part.
 [3] The light emitting device according to [1], further comprising an optical waveguide that transmits light emitted from the laser diode,
  wherein light transmitted through the optical waveguide is irradiated on the wavelength conversion part.
 [4] The light emitting device according to any one of [1] to [3], wherein the wavelength conversion part comprises a single piece of the single crystal phosphor.
 [5] The light emitting device according to any one of [1] to [3], wherein the wavelength conversion part comprises a plurality of particles of the single crystal phosphor that are bound to each other by a binder.
 [6] The light emitting device according to any one of [1] to [5], wherein the single crystal phosphor has a composition represented by a compositional formula

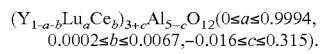

$(Y_{1-a-b}Lu_aCe_b)_{3+c}Al_{5-c}O_{12}$ ($0 \leq a \leq 0.9994$, $0.0002 \leq b \leq 0.0067$, $-0.016 \leq c \leq 0.315$).

[7] The light emitting device according to any one of [1] to [6], wherein the wavelength conversion part is held by a heat dissipation member that comprises aluminum nitride, alumina, SiN, Cu or Al and dissipates heat generated from the wavelength conversion part.

Effects of Invention

According to the invention, it is possible to provide a high-brightness light emitting device which emits white light by means of a combination of a laser diode and a phosphor.

DESCRIPTION OF EMBODIMENTS

A light emitting device of the invention has a laser diode (LD) as a light source and a wavelength conversion part containing a YAG-based single crystal phosphor. The light emitting device emits white light produced by a combination of blue light emitted from the LD and yellow light converted by the YAG-based single crystal phosphor contained in the wavelength conversion part.

Figure 1:
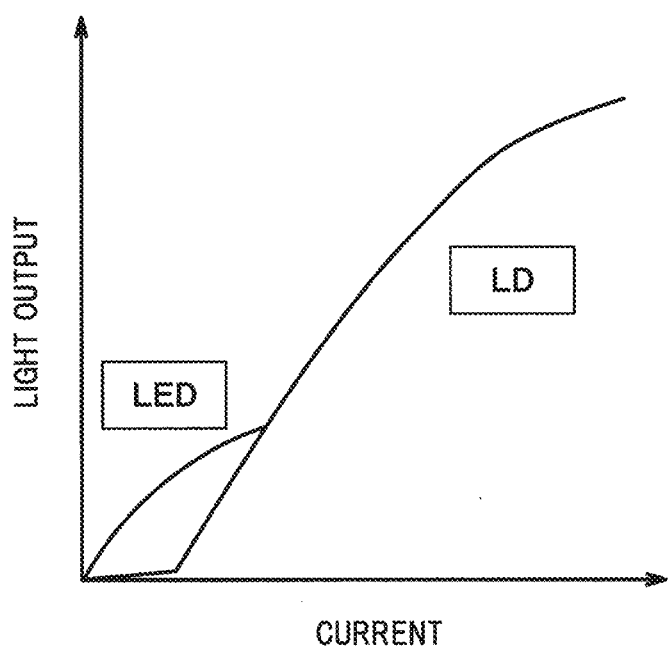
FIG. 1 is a schematic graph showing current-light output characteristics of LD and LED.

FIG. 1 is a schematic graph showing current-light output characteristics of LD and LED. As shown in FIG. 1, LED has good luminous efficiency when applying a small current, but the efficiency decreases as the current increases.

On the other hand, light output of LD increases while maintaining substantially constant luminous efficiency when the current is greater than an oscillation threshold current for laser oscillation. For this reason, luminous efficiency of LD is high when applying a large current. In addition, the maximum light output of LD is larger than that of LED. Furthermore, LD has a smaller light-emitting area (near-field pattern) than LED and a narrower emission angle (far-field pattern) than LED. Thus, when condensing light by a lens, LD can achieve higher light energy, smaller area and light condensation at remarkably higher density than LED.

This means that LD is excellent as a light source of a high-brightness light emitting device.

However, in order to obtain while light by a combination of LD and phosphor, a phosphor capable of converting wavelength of high-energy light from LD with high efficiency needs to be used, otherwise it is not possible to manufacture high-brightness light emitting devices.

In general, phosphor has specific quantum efficiency (efficiency to convert excitation light into fluorescence) and thermal quenching characteristics (property that the quantum efficiency decreases with an increase in temperature). Having high quantum efficiency at high temperature and small thermal quenching are required to convert wavelength of high-energy light with high efficiency.

Thus, a single crystal phosphor, which has better quantum efficiency at high temperature and thermal quenching characteristics than ceramic phosphor produced by sintering, is used in the embodiments.

First Embodiment

A light emitting device in the first embodiment has a transmission structure in which a light extraction surface of a wavelength conversion part is located opposite to an irradiated surface (a surface exposed to light emitted from LD).

(Configuration of Light Emitting Device)

Figure 2:
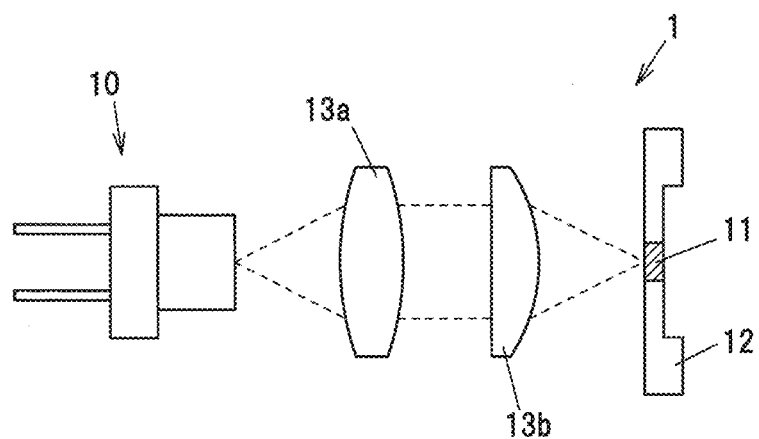
FIG. 2 is a schematic diagram illustrating a configuration of a light emitting device in the first embodiment.
Figure 3:
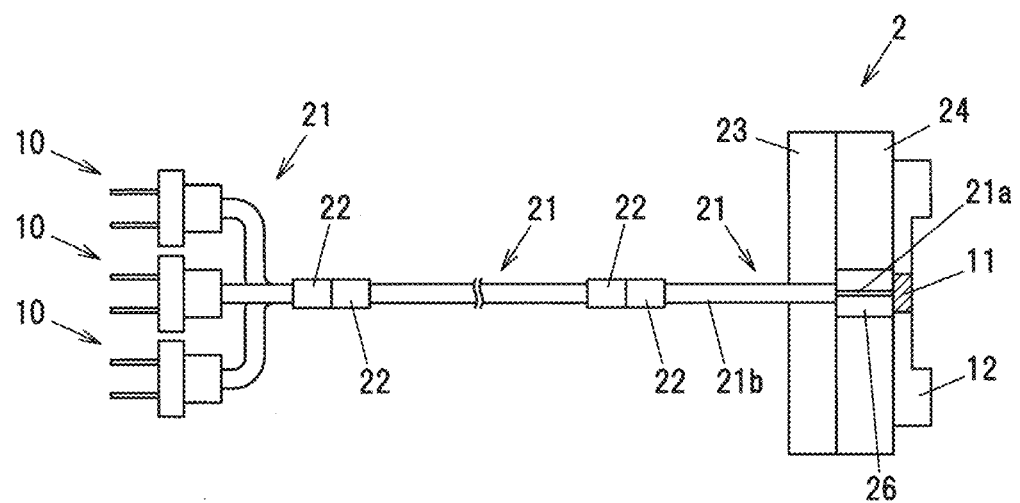
FIG. 3 is a schematic diagram illustrating another configuration of the light emitting device in the first embodiment.

FIGS. 2 and 3 are schematic diagrams illustrating configurations of light emitting devices 1 and 2 in the first embodiment. The light emitting devices 1 and 2 have a laser light emitting device(s) 10 having an LD which emits blue light, and a wavelength conversion part 11 which absorbs a portion of light emitted from the laser light emitting device(s) 10 (light emitted from the LD(s) of the laser light emitting device(s) 10) and converts wavelength thereof.

The light emitting device 1 is further provided with a lens 13a for rendering light emitted from the laser light emitting device 10 into a parallel light, and a lens 13b for condensing the parallel light from the lens 13a so as to be focused in the vicinity of a surface of the wavelength conversion part 11.

Meanwhile, the light emitting device 2 is further provided with an optical fiber 21 as an optical waveguide for transmitting light emitted from the laser light emitting devices 10. The optical fiber 21 has a light propagating portion 21a composed of a core and a cladding, and a cover film 21b covering the light propagating portion 21a.

In the example shown in FIG. 3, the light emitting device 2 also has a support 23 which holds the optical fiber 21 in the vicinity of the wavelength conversion part 11, an annular member 24 surrounding around a tip of the optical fiber 21, and a holding member 26 which is provided between the annular member 24 and the light propagating portion 21a and holds the light propagating portion 21a. The holding member 26 is formed of, e.g., ceramic such as zirconia, or metal. The structure may be such that, e.g., the support 23 is a ferrule and is inserted and fitted to the annular member 24. The outer shape of the annular member 24 may be a circle or square, and may have a discontinuous portion. Alternatively, plural optical fibers 21 connected by connectors 22 as shown in FIG. 3 may be used. In addition, in place of the optical fiber 21, an optical waveguide other than optical fiber, such as light guide pipe, may be used in the light emitting device 2.

The laser light emitting device 10 is a laser module having an LD as a light source. Therefore, "light emitted from the laser light emitting device 10" can be interpreted as "light emitted from the LD in the laser light emitting device 10".

Although a CAN-type laser module is shown as an example of the laser light emitting device 10 in FIGS. 2 and 3, the laser light emitting device 10 may be a laser module of another type. In addition, plural laser light emitting devices 10 may be used for one wavelength conversion part 11 as shown in FIG. 3.

The wavelength conversion part 11 contains a YAG-based single crystal phosphor. The wavelength conversion part 11 is formed of, e.g., a single piece of the YAG-based single crystal phosphor or plural particles of the single crystal phosphor bound to each other by a binder. The single crystal phosphor here means a single-phase phosphor crystal which does not contain any crystal grain boundary.

In the light emitting devices 1 and 2, irradiance of light emitted from the laser light emitting device 10 and irradiated on the wavelength conversion part 11 is not less than 80 W/mm$^2$. By having such increased irradiance, the light emitting devices 1 and 2 can emit highly bright light. The irradiance here means light output (W), per unit area, of light incident on the wavelength conversion part 11.

To increase irradiance, the light emitted from the laser light emitting device 10 is preferably irradiated on the irradiated surface of the wavelength conversion part 11 so that the substantially whole spot is located within the irradiated surface.

Meanwhile, to increase luminance, it is preferable that the size of the wavelength conversion part 11 be sufficiently reduced so that the light emitted from the laser light emitting device 10 is irradiated on the entire irradiated surface of the wavelength conversion part 11. Sufficient luminance can be obtained by reducing the size of the wavelength conversion part 11 even though light is irradiated on the entire irradiated surface.

In the light emitting device 1, a focal point of the light condensed by the lens 13b may be shifted from the surface of the wavelength conversion part 11 so that the spot area is increased. By increasing the spot area, it is possible to evenly mix a blue light component and a fluorescence component and thus possible to reduce unevenness of emission color. To effectively reduce color unevenness, it is preferable that the spot area be increased to not less than 0.06 mm$^2$ and light be irradiated on the wavelength conversion part 11 as uniform as possible. Reducing unevenness of emission color is important in view of uniformity of light and is also important in view of safety since it also has an effect of preventing laser beam as an excitation light from being directly output. By increasing the spot area, it is also possible to reduce heat concentration and thereby to prevent cracks from occurring.

Meanwhile, the closer the irradiated portion of the wavelength conversion part 11 to the outer rim of the wavelength conversion part 11, the higher the heat dissipation is. Thus, when the focal point of the light emitted from the laser light emitting device 10 is shifted from the surface of the wavelength conversion part 11 so that the spot area on the irradiated surface of the wavelength conversion part 11 is not less than about 50% of the entire area of the irradiated surface, heat generation of the phosphor contained in the wavelength conversion part 11 can be effectively suppressed.

However, in case that it is difficult to control the position of the irradiated portion and adjusting the spot area to substantially equal to the irradiated surface area may cause the light to be partially out of the wavelength conversion part 11, the spot area of the light emitted from the laser light emitting device 10 on the irradiated surface of the wavelength conversion part 11 is preferably not more than 90% of the entire area of the irradiated surface.

The wavelength conversion part 11 is held by a holding member 12. The holding member 12 is preferably formed of highly-thermally conductive ceramic or metal to dissipate heat generated by the wavelength conversion part 11. The ceramic used here is, e.g., aluminum nitride, alumina or SiN. Meanwhile, the metal is, e.g., Cu or Al.

To improve light extraction efficiency, fine texture may be provided on the light extraction surface of the wavelength conversion part 11. The fine texture is formed by, e.g., engraving using laser or engraving using a semiconductor process.

(Single Crystal Phosphor)

The single crystal phosphor in the first embodiment is a Ce-activated YAG-based single crystal phosphor and has a composition represented by $(Y_{1-a-b}Lu_a Ce_b)_{3+c}Al_{5-c}O_{12}$ ($0 \le a \le 0.9994$, $0.0002 \le b \le 0.0067$, $-0.016 \le c \le 0.315$). Here, Ce is substituted in the Y site and functions as an activator (becomes the light emission center). On the other hand, Lu is also substituted in the Y site but does not function as an activator.

In the above-mentioned composition of the phosphor, some atoms may be in different positions in the crystal structure. In addition, although the composition ratio of O in the above compositional formula is 12, the above-mentioned composition also includes compositions with an O composition ratio slightly different from 12 due to presence of inevitably mixed oxygen or oxygen deficiency. In addition, the value of c in the compositional formula is a value which inevitably varies in the production of the single crystal phosphor, but variation within the numerical range of about $-0.016 \le c \le 0.315$ have little effect on physical properties of the single crystal phosphor.

The reason why the numerical value of b indicating the Ce concentration in the compositional formula is in a range of $0.0002 \le b \le 0.0067$ is as follows: when the numerical value of b is smaller than 0.0002, there is a problem that the too low Ce concentration causes less absorption of excitation light, resulting in that external quantum efficiency is too low. On the other hand, when larger than 0.0067, cracks or voids, etc., occur during growth of an ingot of single crystal phosphor and the crystal quality is highly likely to degrade.

The single crystal phosphor in the first embodiment can be obtained by, e.g., a liquid-phase growth method such as CZ method (Czochralski method), EFG method (Edge Defined Film Fed Growth Method), Bridgman method, FZ method (Floating Zone method) or Verneuil method, etc.

When the wavelength conversion part 11 is formed of a single piece of the YAG-based single crystal phosphor, an ingot of the single crystal phosphor obtained by such liquid phase growth method is cut and processed into a plate shape, and the wavelength conversion part 11 is thereby obtained. When the wavelength conversion part 11 is formed of plural particles of the single crystal phosphor bound to each other by a binder, an ingot of the single crystal phosphor is processed into particles by crushing and the obtained plural particles of the single crystal phosphor are bound by a binder, thereby obtaining the wavelength conversion part 11.

(Production of the Single Crystal Phosphor)

Next, a production method using the CZ method will be described as an example of a method for producing the single crystal phosphor in the first embodiment.

Firstly, powders of $Y_2O_3$, $Lu_2O_3$, $CeO_2$ and $Al_2O_3$ each having a high purity (not less than 99.99%) are prepared as starting materials and are dry-blended, thereby obtaining a mixture powder. In this regard, the raw material powders of Y, Lu, Ce and Al are not limited to those mentioned above. In addition, when producing a single crystal phosphor not containing Lu, the raw material powder of Lu is not used.

Next, the obtained mixture powder is loaded into a crucible formed of indium and the crucible is then placed in a ceramic cylindrical container. Then, a high-frequency energy of 30 kW is supplied to the crucible by a high-frequency coil wound around the cylindrical container to generate an induced current, and the crucible is thereby heated. The mixture powder is melted and a melt is thereby obtained.

Next, a seed crystal which is a YAG single crystal is prepared, the tip thereof is brought into contact with the melt, and the seed crystal is pulled upward at a pulling rate of not more than 1 mm/h and rotated simultaneously at a rotation speed of 10 rpm at a temperature of not less than 1960° C., thereby growing a single crystal phosphor ingot oriented to the <111> direction. The single crystal phosphor ingot is grown in a nitrogen atmosphere at atmospheric pressure in a state that nitrogen is being supplied at a flow rate of 2 L/min into the cylindrical container.

A single crystal phosphor ingot having, e.g., a diameter of about 2.5 cm and a length of about 5 cm is thereby obtained. A single crystal phosphor having, e.g., a plate shape and used for a light emitting device can be obtained by cutting the obtained single crystal phosphor ingot to a desired size. Otherwise, particles of the single crystal phosphor can be obtained by crushing the single crystal phosphor ingot.

(Structure for Holding the Wavelength Conversion Part)

FIGS. 4 to 13 are cross sectional views showing examples of the structure for holding the wavelength conversion part 11 in the first embodiment.

Figure 4A:
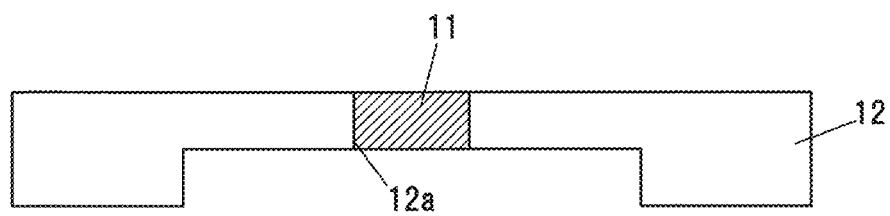
FIG. 4A is a cross sectional view showing an example of a structure for holding a wavelength conversion part in the first embodiment.
Figure 4B:
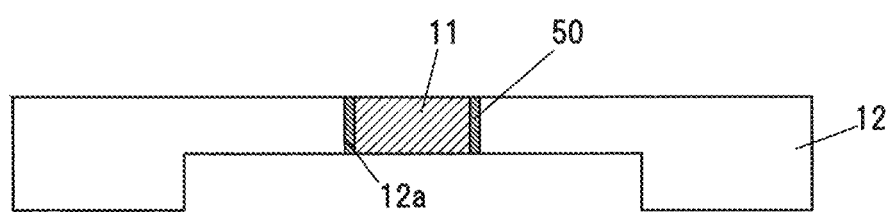
FIG. 4B is a cross sectional view showing another example of the structure for holding the wavelength conversion part in the first embodiment.

In the holding structure shown in FIGS. 4A and 4B, the holding member 12 has a through-hole 12a having substantially the same shape as the wavelength conversion part 11 in a planar view, and the wavelength conversion part 11 is held in the through-hole 12a.

The holding member 12 shown in FIG. 4A is formed of a metal, and the wavelength conversion part 11 inserted into the through-hole 12a is mechanically fixed by plastically deforming the holding member 12. The holding member 12 is preferably formed of, e.g., Cu or Al which are excellent in heat conduction and are easily processed.

The wavelength conversion part 11 shown in FIG. 4B is fixed by a filler 50 which is filled between the through-hole 12a and the wavelength conversion part 11. As the filler 50, it is preferable to use, e.g., a heat-dissipating silicone-based resin with high thermal conductivity, a highly-reflective silicone-based resin, and sintered silver with high reflectance and thermal conductivity, etc.

Figure 5A:
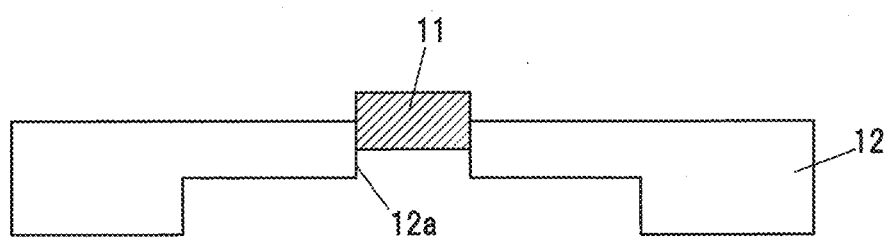
FIG. 5A is a cross sectional view showing another example of the structure for holding the wavelength conversion part in the first embodiment.
Figure 5B:
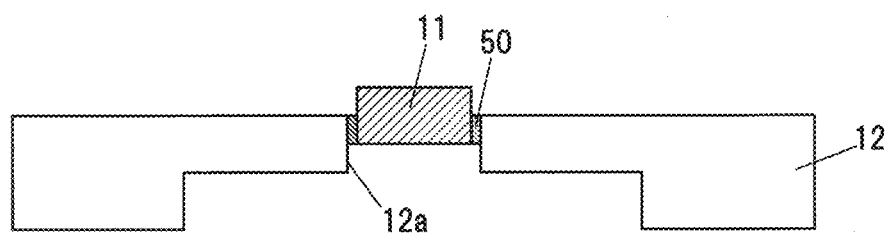
FIG. 5B is a cross sectional view showing another example of the structure for holding the wavelength conversion part in the first embodiment.

In the holding structure shown in FIGS. 5A and 5B, the holding member 12 has the through-hole 12a having substantially the same shape as the wavelength conversion part 11 in a planar view and the wavelength conversion part 11 is held in the through-hole 12a, in the same manner as the holding structure shown in FIGS. 4A and 4B.

The holding member 12 shown in FIG. 5A is mechanically fixed by plastic deformation of the holding member 12 formed of a metal in the same manner as the holding member 12 shown in FIG. 4A. The holding member 12 shown in FIG. 5B is fixed by the filler 50 in the same manner as the holding member 12 shown in FIG. 4B.

In the holding structure shown in FIGS. 5A and 5B, an area of a portion of the wavelength conversion part 11 in contact with the holding member 12 directly or via the filler 50 is not less than 5% and not more than 30% of the entire surface area of the wavelength conversion part 11. By adjusting this percentage to not more than 30%, it is possible to effectively reduce light attenuation at the contact surface of the wavelength conversion part 11 with the holding member 12 caused by repeated reflections. Meanwhile, by adjusting this percentage to not less than 5%, it is possible to effectively conduct heat through the holding member 12 and dissipate heat.

In the holding structure shown in FIG. 5A, the surface of the wavelength conversion part 11 in contact with the holding member 12 and the surface of the holding member 12 in contact with the wavelength conversion part 11 may be mirror-finished. By mirror-finishing the contact surfaces, it is possible to increase the contact area and to dissipate heat through the holding member 12 more effectively.

Figure 6:
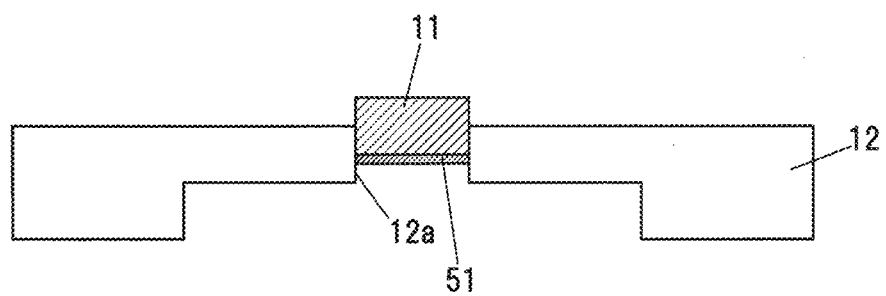
FIG. 6 is a cross sectional view showing another example of the structure for holding the wavelength conversion part in the first embodiment.

The wavelength conversion part 11 shown in FIG. 6 is configured that a film-shaped dichroic filter 51 transmitting only light of a blue wavelength and reflecting light of other wavelengths is provided on the irradiated surface (a surface exposed to light emitted from the laser light emitting device 10). Inside the through-hole 12a, the wavelength conversion part 11 is fixed to the holding member 12 mechanically or by the filler 50.

The dichroic filter 51 is applied directly to the irradiated surface of the wavelength conversion part 11 and thus has high adhesion to the wavelength conversion part 11. Therefore, unlike the case where the wavelength conversion part 11 is placed on a preliminarily provided dichroic filter, a thin air layer is not formed therebetween. Therefore, light scattering by the air layer is prevented and high luminous efficiency is obtained. The dichroic filter 51 may alternatively be formed on a surface other than the irradiated surface as long as it is a surface other than the light extraction surface of the wavelength conversion part 11.

Figure 7:
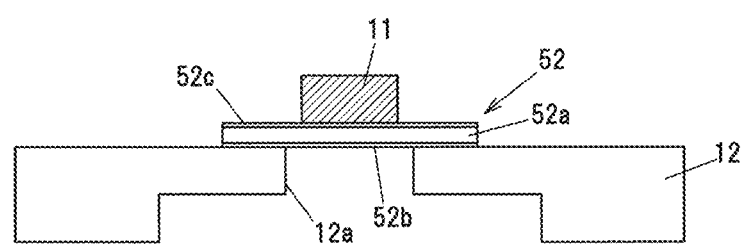
FIG. 7 is a cross sectional view showing another example of the structure for holding the wavelength conversion part in the first embodiment.

In the holding structure shown in FIG. 7, the wavelength conversion part 11 is placed on the holding member 12 via a band-pass filter 52 which is arranged to cover the through-hole 12a of the holding member 12.

The band-pass filter 52 is composed of a transparent substrate 52a formed of a transparent material such as glass, quartz, SiC or sapphire, an antireflection film 52b formed on the lower surface of the transparent substrate 52a (a surface exposed to light emitted from the laser light emitting device 10), and a film-shaped dichroic filter 52c which is formed on the upper surface of the transparent substrate 52a (a surface on the wavelength conversion part 11 side) and transmits only blue light.

The light emitted from the laser light emitting device 10 is incident on the band-pass filter 52 and then reaches the wavelength conversion part 11. Therefore, as compared to the case where light in the air is directly incident on the wavelength conversion part 11, loss of the incident light by reflection and loss due to return of light emitted in the wavelength conversion part 11 are reduced and luminous efficiency is improved. In addition, a cooling effect by transferring heat from the wavelength conversion part 11 to the transparent substrate 52a is also obtained.

The wavelength conversion part 11 is bonded to the band-pass filter 52 by a translucent adhesive, etc., containing glass, etc. Meanwhile, the band-pass filter 52 is bonded to the holding member 12 by the translucent member mentioned above, metal such as solder, or a bonding material such as sintered silver.

Figure 8:
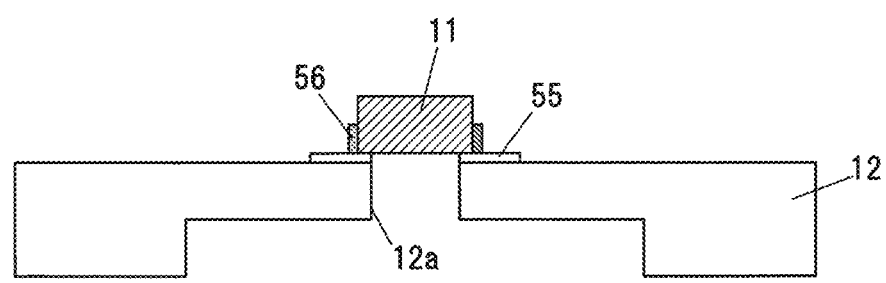
FIG. 8 is a cross sectional view showing another example of the structure for holding the wavelength conversion part in the first embodiment.

The wavelength conversion part 11 shown in FIG. 8 has a metal film 56 covering a portion of the side surface on the irradiated surface side. The metal film 56 reflects light traveling inside the wavelength conversion part 11 toward the metal film 56 and prevents the light from exiting from the portion of the side surface of the wavelength conversion part 11 on the irradiated surface side.

The metal film 56 is formed by metallizing the surface of the wavelength conversion part 11. In detail, a single crystal phosphor plate before processing into individual wavelength conversion parts 11 or a plate-shaped member formed by binding plural particles of a single crystal phosphor by a binder is metalized after half-cut dicing, thereby forming the metal film 56 only on a portion of the side surface of the wavelength conversion part 11. The metal film formed on the irradiated surface of the wavelength conversion part 11 is removed by polishing, etching using a photolithographic process, or a lift-off process.

The wavelength conversion part 11 is joined to the holding member 12 by metal such as solder, or a bonding material 55 which is sintered silver. Bonding by solder etc., is easier than mechanical fixation.

Figure 9:
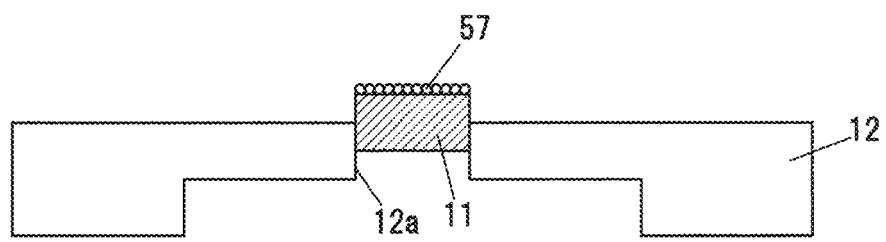
FIG. 9 is a cross sectional view showing another example of the structure for holding the wavelength conversion part in the first embodiment.

A powdery scattering agent 57 mixed in a translucent carrying agent (not shown) is applied to the upper surface (a surface on the light extraction side) of the wavelength conversion part 11 shown in FIG. 9. Since the light extracted from the wavelength conversion part 11 is scattered by the scattering agent 57, intensity distribution and color distribution are uniformized.

The particle size of the scattering agent 57 or phosphor powder is preferably 5 to 50 µm. Reflection loss increases when the particle size is less than 5 µm, while it is difficult to control the layer thickness of the scattering agent 57 when more than 50 µm. As the translucent carrying agent, it is possible to use, e.g., a glass-based adhesive or a heat-resistant resin adhesive. Inside the through-hole 12a, the wavelength conversion part 11 is fixed to the holding member 12 mechanically or by the filler 50.

Phosphor powder may be used in place of the scattering agent 57 to adjust emission color.

Figure 10:
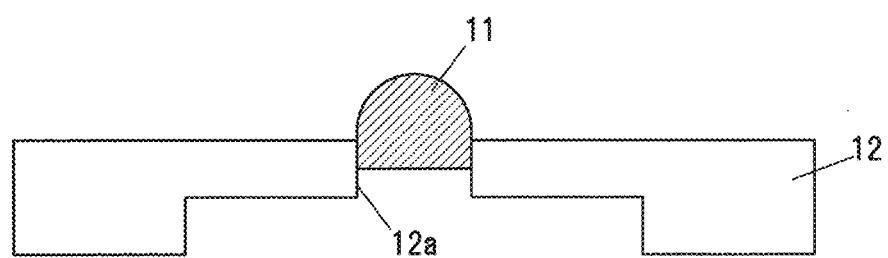
FIG. 10 is a cross sectional view showing another example of the structure for holding the wavelength conversion part in the first embodiment.

The wavelength conversion part 11 shown in FIG. 10 is configured that a portion on the light extraction side protrudes on the light extraction side beyond the surface of the holding member 12 and this protruding portion has a hemispherical shape, a balance scale weight shape, a frustum shape, or a shape close to these shapes. In this case, the optical path difference between light in the wavelength conversion part 11 and light extracted from the wavelength conversion part 11 is smaller than when using a rectangular parallelepiped-shaped wavelength conversion part 11, and unevenness of emission color is thus reduced.

To obtain the protruding portion of the wavelength conversion part 11, for example, a rectangular parallelepiped-shaped wavelength conversion part 11 cut out from a single crystal phosphor ingot, etc., is ground by a grinding stone. Alternatively, using a multi-axis processing machine, a plate-shaped single crystal phosphor, etc., may be machined by a microfabrication gimlet and then cut out. Meanwhile, it is difficult to handle when the length of one side of the wavelength conversion part 11 is not more than 300 µm. In such a case, a plate-shaped single crystal phosphor, etc., may be attached to a support substrate and then processed. A method using barrel polishing or chemicals may be also used to process the protruding portion.

Inside the through-hole 12a, the wavelength conversion part 11 is fixed to the holding member 12 mechanically or by the filler 50.

Figure 11A:
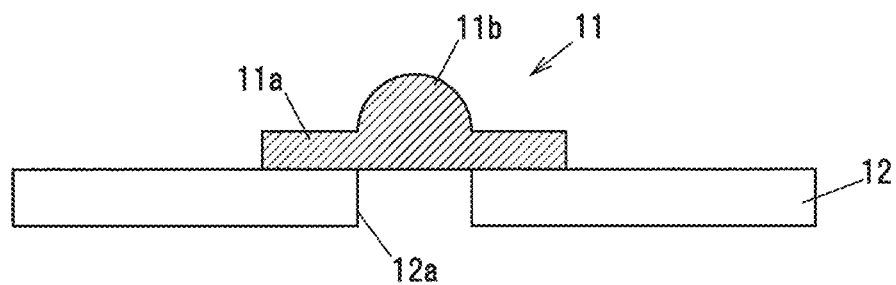
FIG. 11A is a cross sectional view showing another example of the structure for holding the wavelength conversion part in the first embodiment.
Figure 11B:
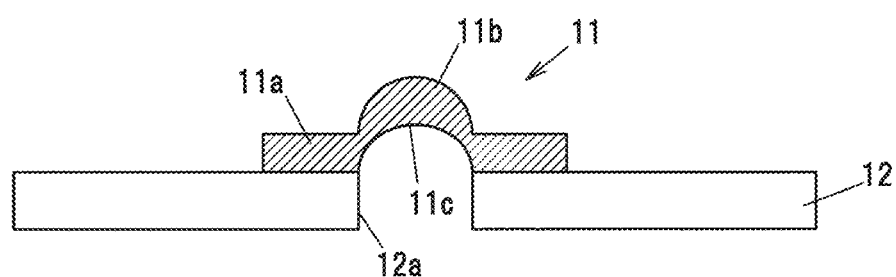
FIG. 11B is a cross sectional view showing another example of the structure for holding the wavelength conversion part in the first embodiment.
Figure 11C:
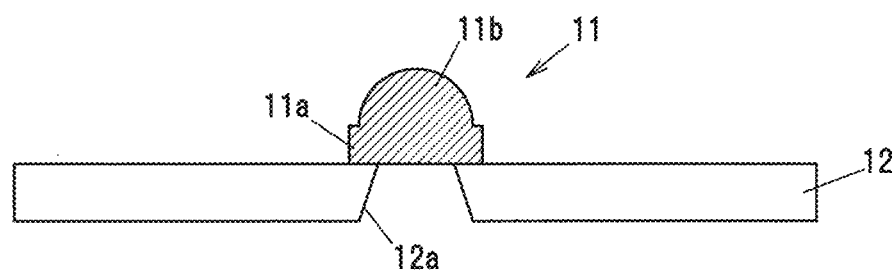
FIG. 11C is a cross sectional view showing another example of the structure for holding the wavelength conversion part in the first embodiment.

The wavelength conversion parts 11 shown in FIGS. 11A, 11B and 11C are formed of a YAG-based single crystal phosphor and have a flat plate portion 11a placed to cover the through-hole 12a of the holding member 12, and a protruding portion 11b which is placed immediately above the through-hole 12a and has a shape of hemisphere, balance scale weight or frustum, etc.

The diameter of the protruding portion 11b is the same as or larger than the diameter of the through-hole 12a, and the central axis of the protruding portion 11b substantially coincides with the central axis of the through-hole 12a. The wavelength conversion part 11 is adhered to the holding member 12 by an adhesive agent or adhesive sheet (not shown), etc.

The wavelength conversion part 11 shown in FIG. 11B has an indentation 11c on a surface on the holding member 12 side in a region under the protruding portion 11b. By providing the indentation 11c, it is possible to reduce light traveling inside the wavelength conversion part 11 and also to suppress an increase in size of the light source.

In case of the wavelength conversion part 11 shown in FIG. 11C, the size of the flat plate portion 11a is reduced and the increase in size of the light source is thereby suppressed. The through-hole 12a may alternatively have a tapered shape which tapers toward the light extraction surface as shown in FIG. 11C.

Figure 12A:
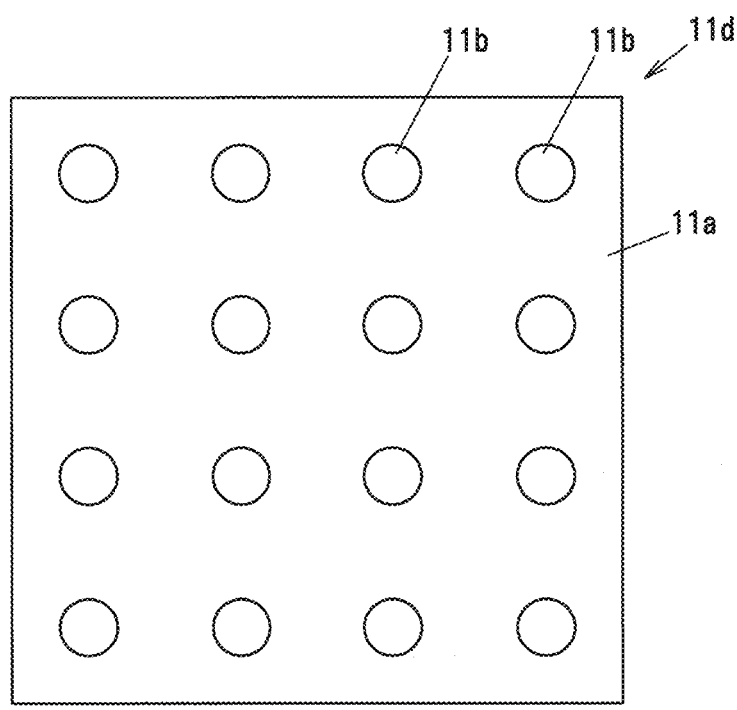
FIG. 12A is top and vertical cross-sectional views showing a single crystal phosphor plate from which the wavelength conversion parts shown in FIGS. 11A, 11B and 11C are cut out.
Figure 12B:
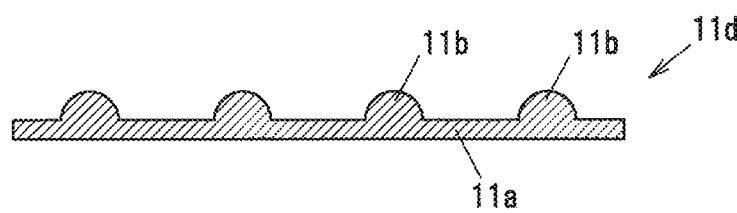
FIG. 12B is top and vertical cross-sectional views showing a single crystal phosphor plate from which the wavelength conversion parts shown in FIGS. 11A, 11B and 11C are cut out.

FIGS. 12A and 12B are top and vertical cross-sectional views showing a single crystal phosphor plate 11d from which the wavelength conversion parts 11 shown in FIGS. 11A, 11B and 11C are cut out. The single crystal phosphor plate 11d is obtained by, e.g., grinding a surface of a plate-shaped YAG-based single crystal phosphor so that the protruding portions 11b arranged in a matrix pattern are formed.

After obtaining individual wavelength conversion parts 11 by cutting the single crystal phosphor plate 11d, each individual wavelength conversion part 11 is fixed to the holding member 12. Alternatively, a metal plate or a ceramic plate for cutting out plural holding members 12 and the single crystal phosphor plate 11d adhered thereto may be cut together into individual pieces.

The indentation 11c of the wavelength conversion part 11 shown in FIG. 11B may be formed either before or after fixing the wavelength conversion part 11 to the holding member 12.

Figure 13:
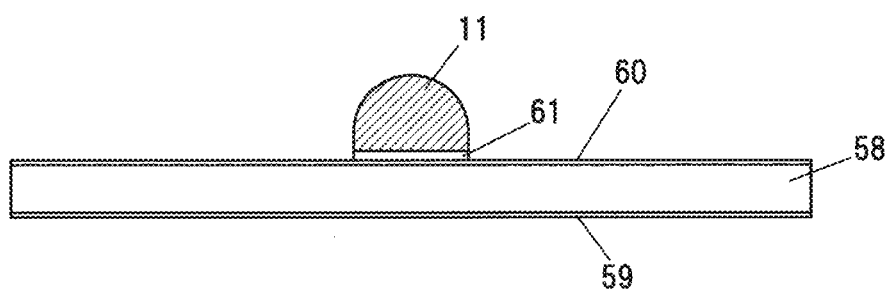
FIG. 13 is a cross sectional view showing another example of the structure for holding the wavelength conversion part in the first embodiment.

The wavelength conversion part 11 shown in FIG. 13 is fixed onto a transparent substrate 58 as a holding member by a transparent adhesive 61. The transparent substrate 58 may be configured that an antireflection film 59 is provided on the lower surface (a surface exposed to light emitted from the laser light emitting device 10) and a film-shaped dichroic filter 60 transmitting only light of a blue wavelength and reflecting light of other wavelengths is provided on the upper surface (a surface on the wavelength conversion part 11 side), as shown in FIG. 13.

The shape of the wavelength conversion part 11 is, e.g., a rectangular parallelepiped shape, hemisphere or a pyramid shape. The transparent substrate 58 is formed of, e.g., a transparent material such as glass, quartz, SiC or sapphire.

Fixation of the wavelength conversion part 11 to the transparent substrate 58 using the transparent adhesive 61 is easier than fixation to the holding member 12 having the through-hole 12a. In addition, heat generated in the wavelength conversion part 11 is dissipated through the transparent adhesive 61.

The wavelength conversion part 11 may be bonded to the holding member 12 by an adhesive applied to a side portion of the wavelength conversion part 11, instead of using the transparent adhesive 61. The adhesive in this case may not be transparent. When not transparent, it is possible to reduce the size of the light source by limiting the light exit direction to above the wavelength conversion part 11. In addition, to increase light intensity, the adhesive may be highly reflective to blue light emitted from the laser light emitting device 10 or to fluorescence.

Second Embodiment

The light emitting device in the second embodiment has a structure in which the light extraction surface of the wavelength conversion part is not located opposite to the irradiated surface.

(Configuration of Light Emitting Device)

Figure 14:
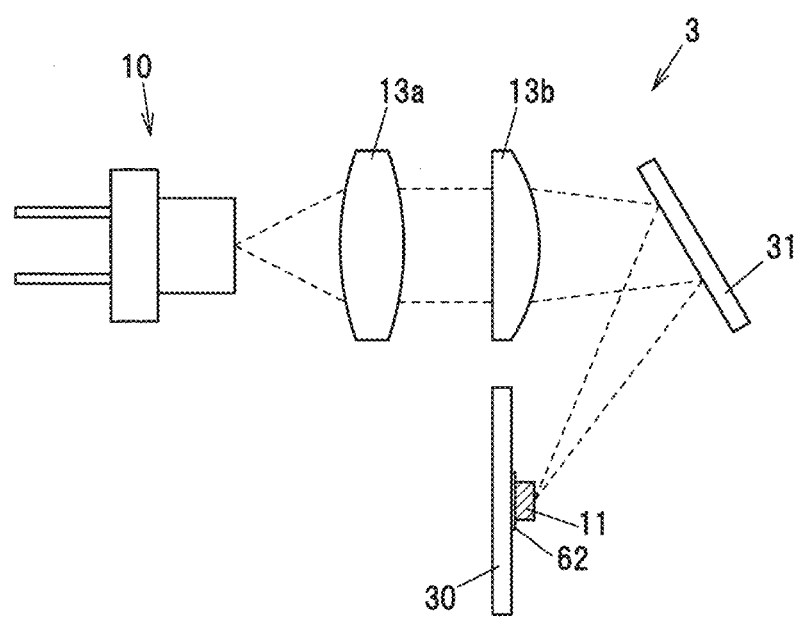
FIG. 14 is a schematic diagram illustrating a configuration of a light emitting device in the second embodiment.
Figure 15:
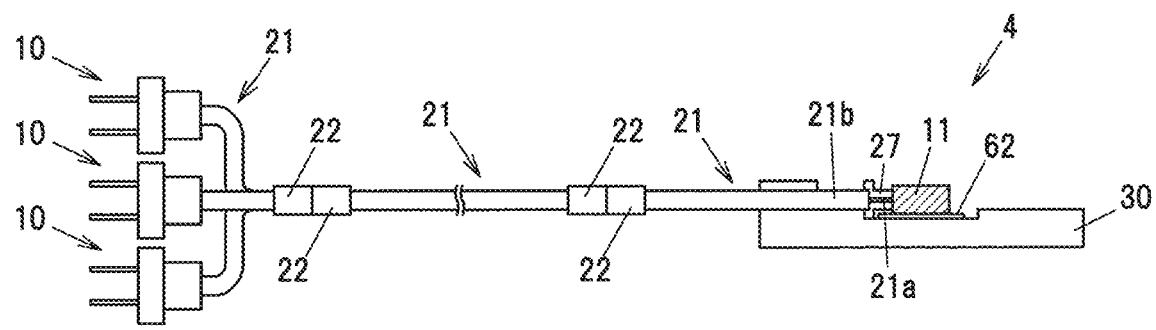
FIG. 15 is a schematic diagram illustrating another configuration of the light emitting device in the second embodiment.

FIGS. 14 and 15 are schematic diagrams illustrating configurations of light emitting devices 3 and 4 in the second embodiment. The light emitting devices 3 and 4 have the laser light emitting device(s) 10 having a laser diode which emits blue light, and the conversion part 11 which absorbs a portion of light emitted from the laser diode(s) of the laser light emitting device(s) 10 and converts wavelength thereof, in the same manner as the light emitting devices 1 and 2.

The light emitting device 3 is further provided with the lens 13a for rendering light emitted from the laser light emitting device 10 into a parallel light, the lens 13b for condensing the parallel light from the lens 13a so as to be focused in the vicinity of a surface of the wavelength conversion part 11, and a mirror 31 which reflects light from the lens 13b toward the wavelength conversion part 11. In the light emitting device 3, the light emitted from the laser light emitting device 10 is irradiated mainly on a surface located on the light extraction side.

Meanwhile, the light emitting device 4 is further provided with the optical fiber 21 as an optical waveguide for transmitting light emitted from the laser light emitting devices 10. An end of the optical fiber 21 is arranged beside the wavelength conversion part 11, and the light emitted from the laser light emitting devices 10 is irradiated on a side surface of the wavelength conversion part 11. The light propagating portion 21a of the optical fiber 21 is held by a holding member 27.

Alternatively, plural optical fibers 21 connected by the connectors 22 as shown in FIG. 15 may be used. In addition, plural laser light emitting devices 10 may be used for one wavelength conversion part 11 as shown in FIG. 15. In addition, in place of the optical fiber 21, an optical waveguide other than optical fiber, such as light guide pipe, may be used in the light emitting device 4.

In the light emitting devices 3 and 4, irradiance of light emitted from the laser light emitting device 10 and irradiated on the wavelength conversion part 11 is not less than 80 W/mm$^2$. By having such increased irradiance, the light emitting devices 3 and 4 can emit highly bright light.

To increase irradiance, the light emitted from the laser light emitting device 10 is preferably irradiated on the irradiated surface of the wavelength conversion part 11 so that the substantially whole spot is located within the irradiated surface.

Meanwhile, to increase luminance, it is preferable that the size of the wavelength conversion part 11 be sufficiently reduced so that the light emitted from the laser light emitting device 10 is irradiated on the entire irradiated surface of the wavelength conversion part 11. Sufficient luminance can be obtained by reducing the size of the wavelength conversion part 11 even though light is irradiated on the entire irradiated surface.

In the light emitting device 3, a focal point of the light condensed by the lens 13b may be shifted from the surface of the wavelength conversion part 11 so that the spot area is increased. By increasing the spot area, it is possible to evenly mix a blue light component and a fluorescence component and thus possible to reduce unevenness of emission color. To effectively reduce color unevenness, it is preferable that the spot area be increased to not less than 0.06 mm$^2$ and light be irradiated on the wavelength conversion part 11 as uniform as possible. Reducing unevenness of emission color is important in view of uniformity of light and is also important in view of safety since it also has an effect of preventing laser beam as an excitation light from being directly output. By increasing the spot area, it is also possible to reduce heat concentration and thereby to prevent cracks from occurring.

Meanwhile, the closer the irradiated portion of the wavelength conversion part 11 to the outer rim of the wavelength conversion part 11, the higher the heat dissipation is. Thus, when the focal point of the light emitted from the laser light emitting device 10 is shifted from the surface of the wavelength conversion part 11 so that the spot area on the irradiated surface of the wavelength conversion part 11 is not less than about 50% of the entire area of the irradiated surface, heat generation of the phosphor contained in the wavelength conversion part 11 can be effectively suppressed.

However, in case that it is difficult to control the position of the irradiated portion and the light emitted from the laser light emitting device 10 could be partially out of the wavelength conversion part 11, the spot area of the light emitted from the laser light emitting device 10 on the irradiated surface of the wavelength conversion part 11 is preferably not more than 90% of the entire area of the irradiated surface.

The wavelength conversion part 11 is held by a holding member 30. The holding member 30 is preferably formed of highly-thermally conductive ceramic or metal to dissipate heat generated by the wavelength conversion part 11. The ceramic used here is, e.g., aluminum nitride, alumina or SiN. Meanwhile, the metal is, e.g., Cu or Al.

(Structure for Holding the Wavelength Conversion Part)

FIGS. 16 to 20 are cross sectional views showing examples of the structure for holding the wavelength conversion part 11 in the second embodiment.

Figure 16:
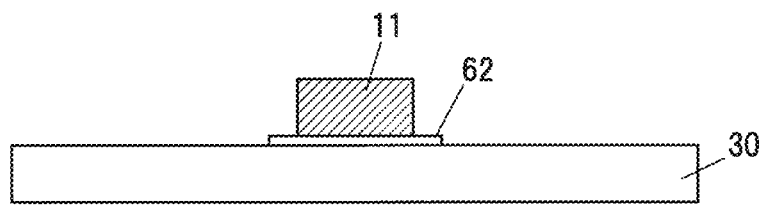
FIG. 16 is a cross sectional view showing an example of the structure for holding the wavelength conversion part in the second embodiment.

In the holding structure shown in FIG. 16, the wavelength conversion part 11 is held on a surface of the holding member 30. The wavelength conversion part 11 is fixed to the holding member 30 by filling a filler 62 between the wavelength conversion part 11 and the holding member 30.

As the filler 62, it is preferable to use, e.g., a heat-dissipating silicone-based resin with high thermal conductivity, a highly-reflective silicone-based resin, and sintered silver with high reflectance and thermal conductivity, etc. Alternatively, the wavelength conversion part 11 may be mechanically fixed by plastically deforming the holding member 30 without using the filler 62.

Figure 17:
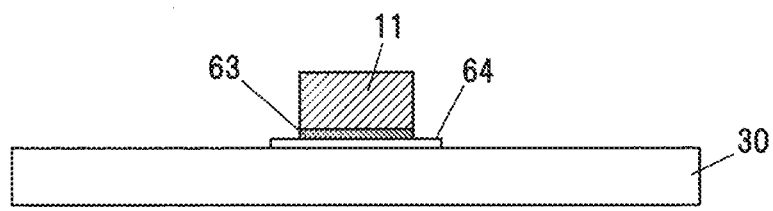
FIG. 17 is a cross sectional view showing another example of the structure for holding the wavelength conversion part in the second embodiment.

The wavelength conversion part 11 shown in FIG. 17 is configured that a film-shaped dichroic filter 63 reflecting visible light is provided on the bottom surface (a surface on the holding member 30 side). By providing the dichroic filter 63, it is possible to improve reflectance at the bottom surface of the wavelength conversion part 11 and thereby to improve light extraction efficiency. In this method using the dichroic filter 63, an air layer is not formed between the wavelength conversion part 11 and the holding member 30 and it is thus possible to suppress a decrease in light extraction efficiency due to light scattering as compared to, e.g., a method of improving reflectance by mirror-finishing the bottom surface of the wavelength conversion part 11 or the upper surface of the holding member 30.

As a bonding material 64 for joining the wavelength conversion part 11 to the holding member 30, it is possible to use, e.g., a conductive sheet, solder, sintered metal or a resin adhesive. The dichroic filter 63 may alternatively be formed on a surface other than the bottom surface as long as it is a surface other than the light extraction surface of the wavelength conversion part 11.

Figure 18:
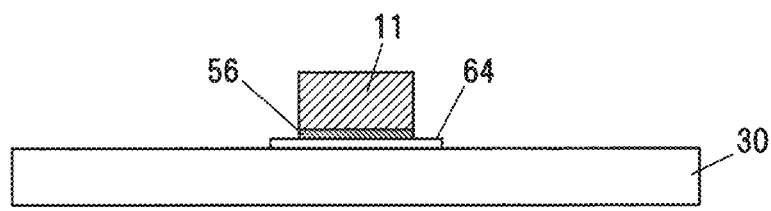
FIG. 18 is a cross sectional view showing another example of the structure for holding the wavelength conversion part in the second embodiment.

The wavelength conversion part 11 shown in FIG. 18 is configured that the metal film 56 is provided on the bottom surface (a surface on the holding member 30 side). By providing the metal film 56, it is possible to improve reflectance at the bottom surface of the wavelength conversion part 11 and thereby to improve light extraction efficiency.

The metal film 56 is formed by metallizing the surface of the wavelength conversion part 11. For example, a single crystal phosphor plate before processing into individual wavelength conversion parts 11 or a plate-shaped member by binding plural particles of a single crystal phosphor by a binder is divided into individual wavelength conversion parts 11 after a surface thereof is metalized, thereby obtaining the metal film 56.

The wavelength conversion part 11 is fixed to the holding member 30 by the bonding material 64. Grease is easily processed but is not suitable for use as the bonding material 64 due to its low reflectance and weak adhesion.

Figure 19:
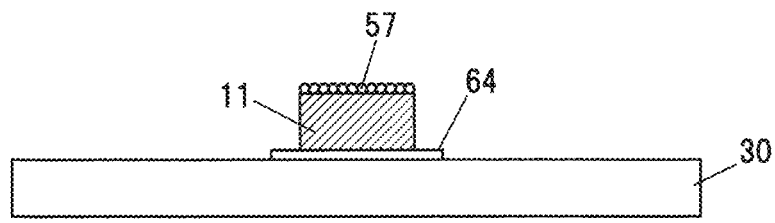
FIG. 19 is a cross sectional view showing another example of the structure for holding the wavelength conversion part in the second embodiment.

The powdery scattering agent 57 mixed in a translucent carrying agent (not shown) is applied to the light extraction surface of the wavelength conversion part 11 shown in FIG. 19. Since the light extracted from the wavelength conversion part 11 is scattered by the scattering agent 57, intensity distribution and color distribution are uniformized.

The particle size of the scattering agent 57 or phosphor powder is preferably 5 to 50 µm. Reflection loss increases when the particle size is less than 5 µm, while it is difficult to control the layer thickness of the scattering agent 57 when more than 50 µm. As the translucent carrying agent, it is possible to use, e.g., a glass-based adhesive or a heat-resistant resin adhesive. The wavelength conversion part 11 is fixed to the holding member 30 by the bonding material 64.

Phosphor powder may be used in place of the scattering agent 57 to adjust emission color.

Figure 20:
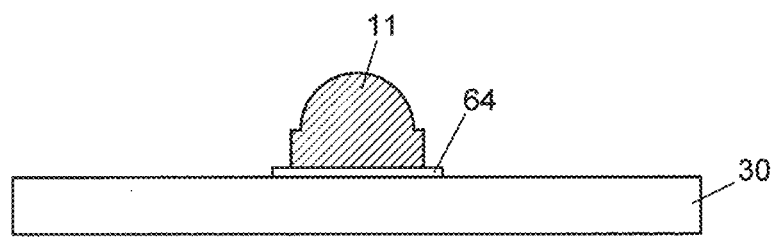
FIG. 20 is a cross sectional view showing another example of the structure for holding the wavelength conversion part in the second embodiment.

The wavelength conversion part 11 shown in FIG. 20 is the same as the wavelength conversion part 11 shown in FIG. 11C, but may alternatively be the same as the wavelength conversion part 11 shown in FIG. 11A. The wavelength conversion part 11 is fixed to the holding member 30 by the bonding material 64.

Third Embodiment

The third embodiment is to show examples of using the light emitting devices in the first embodiment and the second embodiment.

Figure 21:
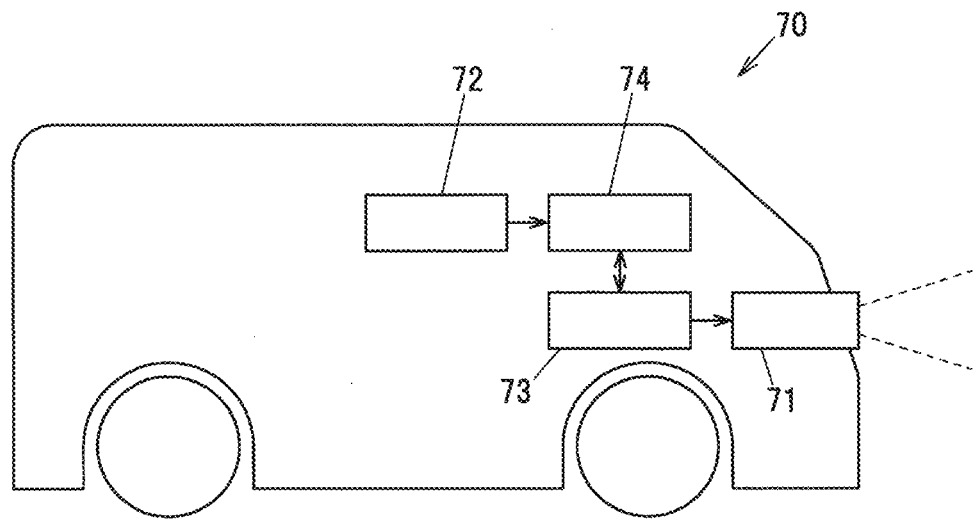
FIG. 21 is a schematic block diagram illustrating a configuration around a vehicle headlamp in the third embodiment.

FIG. 21 is a schematic block diagram illustrating a configuration around a headlamp of a vehicle 70 in the third embodiment.

The vehicle 70 has a headlamp 71, a power supply 73 for supplying power to the headlamp 71, etc., and a control unit 74 controlling the power supply 73 based on an instruction input to an input portion 72.

Figure 22:
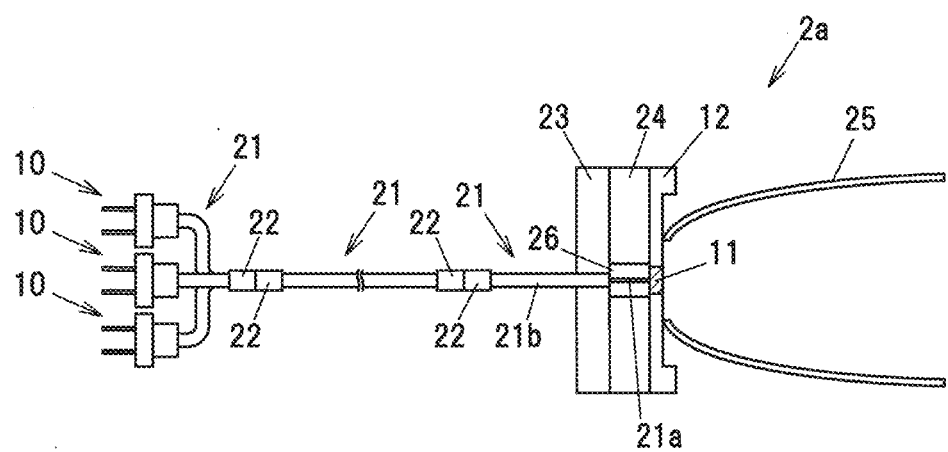
FIG. 22 is a schematic diagram illustrating an example configuration of the light emitting device included in the headlamp.

FIG. 22 is a schematic diagram illustrating a configuration of a light emitting device 2a which is an example of the light emitting device included in the headlamp 71. The light emitting device 2a has a configuration obtained by adding a reflector 25 to the light emitting device 2 shown in FIG. 3. The reflector 25 is attached to the holding member 12, etc., and reflects white light extracted from the wavelength conversion part 11 so that directionality is imparted to the light.

Figure 23:
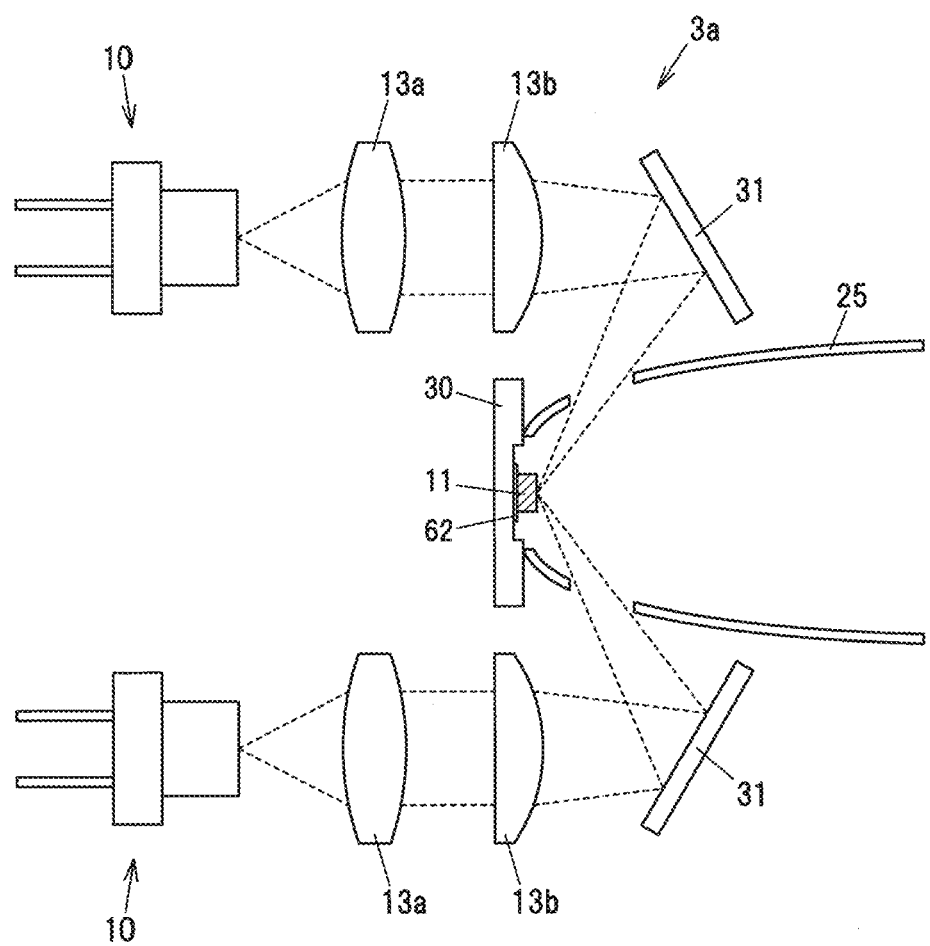
FIG. 23 is a schematic diagram illustrating another example configuration of the light emitting device included in the headlamp.

FIG. 23 is a schematic diagram illustrating a configuration of a light emitting device 3a which is another example of the light emitting device included in the headlamp 71. The light emitting device 3a has a configuration obtained by adding the reflector 25 to the light emitting device 3 shown in FIG. 14.

In the light emitting device 3a, two laser light emitting devices 10 are used for one wavelength conversion part 11 and lights emitted from the two laser light emitting devices 10 are irradiated on the wavelength conversion part 11 from different directions. The reflector 25 is attached to the holding member 12, etc., and has holes for passing the lights emitted from the two laser light emitting devices 10.

Figure 24:
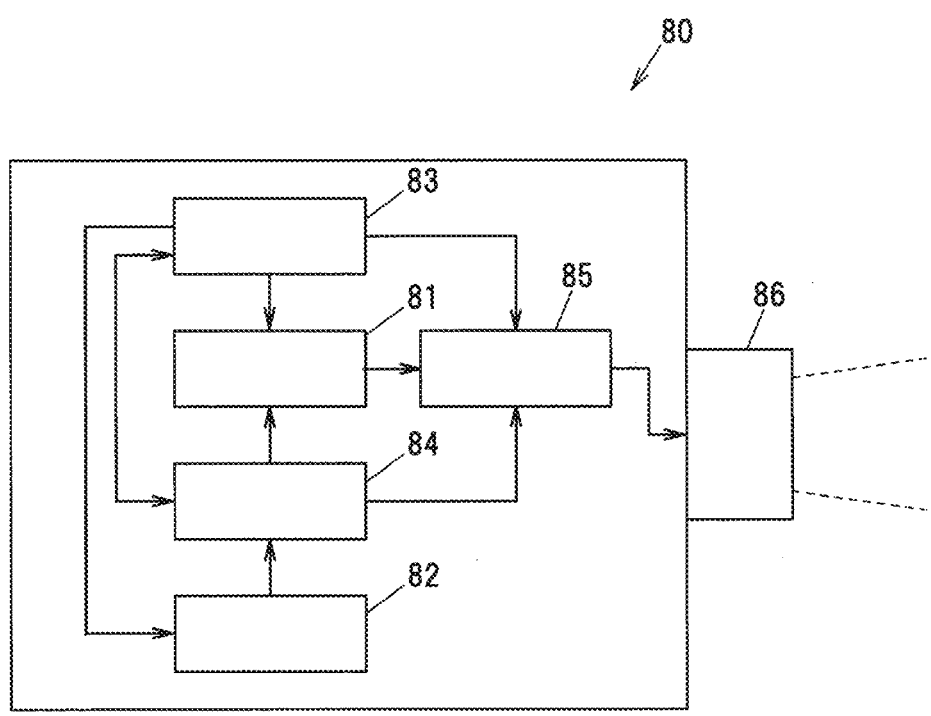
FIG. 24 is a schematic block diagram illustrating a configuration of a projector in the third embodiment.

FIG. 24 is a schematic block diagram illustrating a configuration of a projector 80 in the third embodiment.

The projector 80 has a light source portion 81, a control unit 84 controlling the light source portion 81, etc., based on an instruction input to an input portion 82, a power supply 83 for supplying power to the light source portion 81, etc., an optical system 85 which adds image information to light emitted from the light source portion 81 and sends the light to a projector lens 86, and the projector lens 86 for projecting an image on an external screen.

Figure 25:
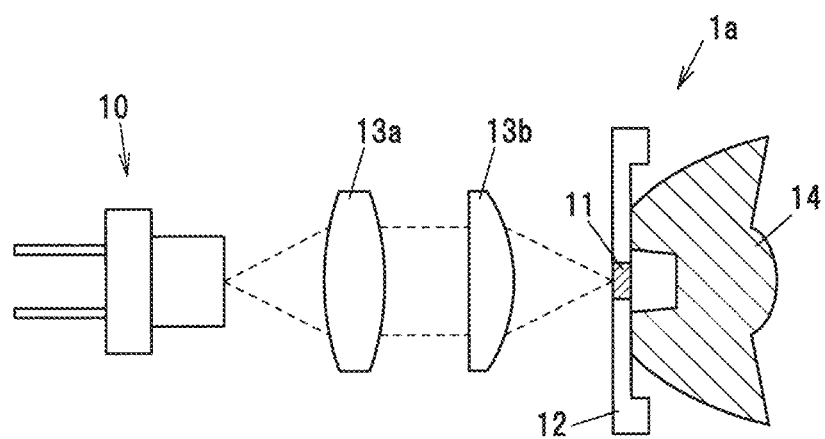
FIG. 25 is a schematic diagram illustrating an example configuration of the light emitting device included in a light source of the projector.

FIG. 25 is a schematic diagram illustrating a configuration of a light emitting device 1a which is an example of the light emitting device included in the light source portion 81. The light emitting device 1a has a configuration obtained by adding an ultra narrow-angle lens 14 to the light emitting device 1 shown in FIG. 2. The ultra narrow-angle lens 14 is attached to the holding member 12, etc., and imparts directionality to white light extracted from the wavelength conversion part 11.

Figure 26:
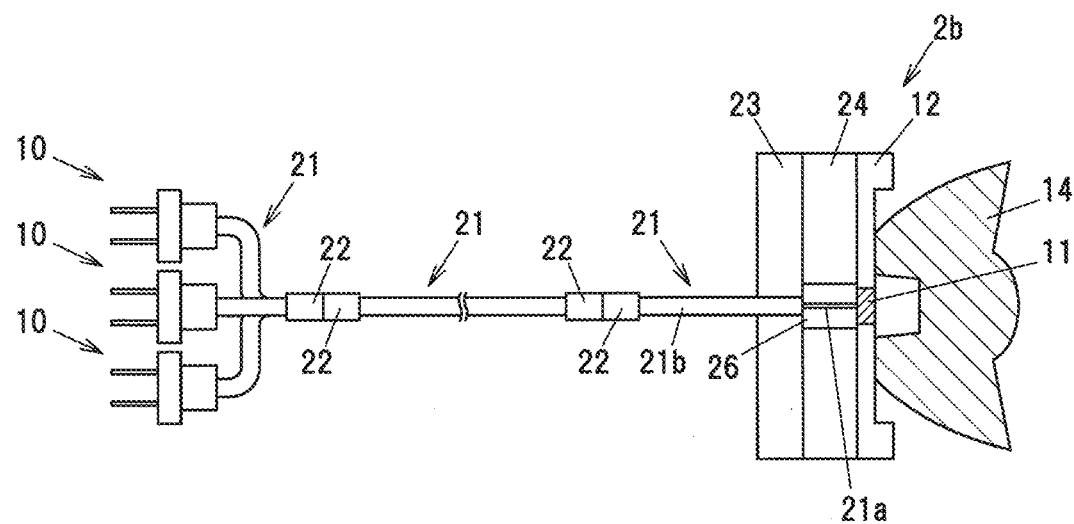
FIG. 26 is a schematic diagram illustrating another example configuration of the light emitting device included in the light source of the projector.

FIG. 26 is a schematic diagram illustrating a configuration of a light emitting device 2b which is another example of the light emitting device included in the light source portion 81. The light emitting device 2b has a configuration obtained by adding the ultra narrow-angle lens 14 to the light emitting device 2 shown in FIG. 3.

Figure 27:
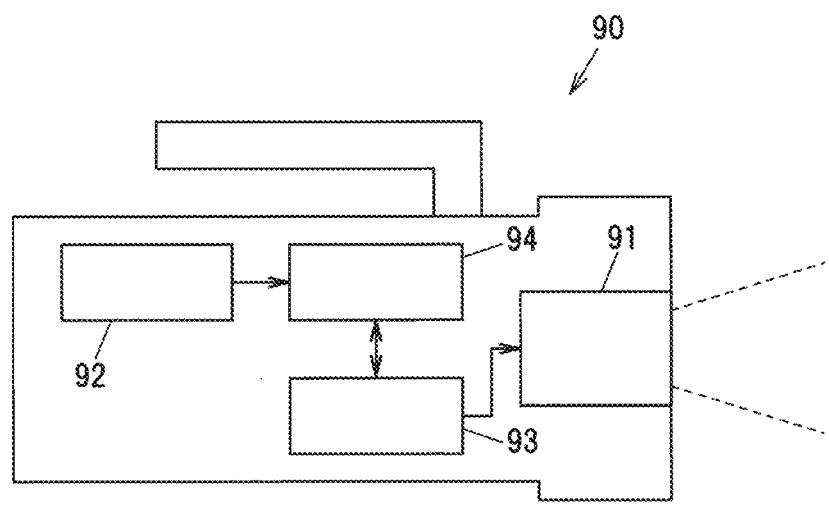
FIG. 27 is a schematic block diagram illustrating a configuration of a searchlight in the third embodiment.

FIG. 27 is a schematic block diagram illustrating a configuration of a searchlight 90 in the third embodiment.

The searchlight 90 has a light source portion 91, a power supply 93 for supplying power to the light source portion 91, etc., and a control unit 94 controlling the power supply 93 based on an instruction input to an input portion 92.

As the light source portion 91, it is possible to use, e.g., the light emitting device 2b shown in FIG. 26.

Figure 28:
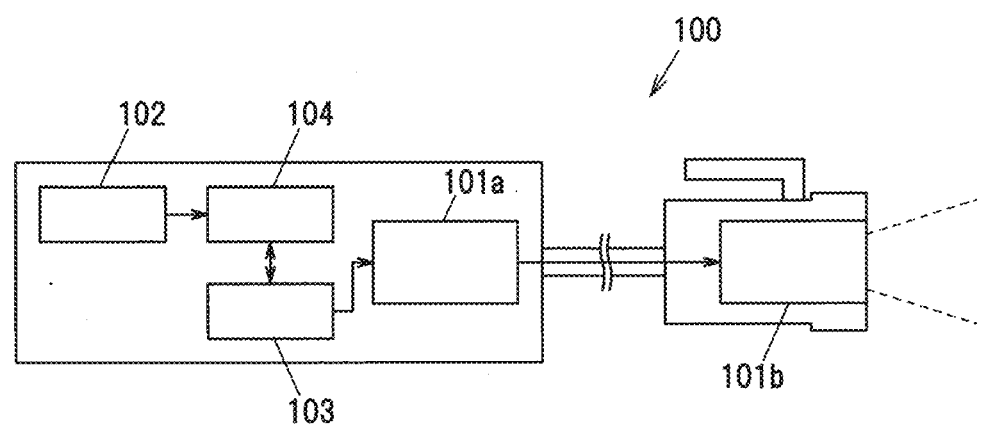
FIG. 28 is a schematic block diagram illustrating a configuration of a remote light in the third embodiment.

FIG. 28 is a schematic block diagram illustrating a configuration of a remote light 100 in the third embodiment.

The remote light 100 has light source portions 101a and 101b, a power supply 103 for supplying power to the light source portions 101a and 101b, etc., and a control unit 104 controlling the power supply 103 based on an instruction input to an input portion 102. The light source portion 101a and the light source portion 101b are respectively housed in separate cases which are connected by a cable, and a user can illuminate an object while holding only the portion housing the light source portion 101b.

Figure 29:
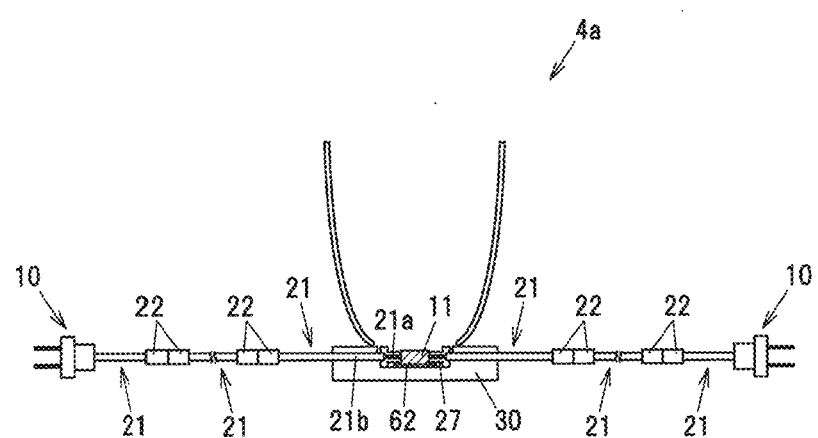
FIG. 29 is a schematic diagram illustrating an example configuration of the light emitting device included in a headlight of the remote light.

FIG. 29 is a schematic diagram illustrating a configuration of a light emitting device 4a which is an example of the light emitting device included in the headlamp 71. The light emitting device 4a has a configuration obtained by adding the reflector 25 to the light emitting device 4 shown in FIG. 15.

In the light emitting device 4a, two laser light emitting devices 10 are used for one wavelength conversion part 11 and lights emitted from the two laser light emitting devices 10 are irradiated on the wavelength conversion part 11 from different directions. The reflector 25 is attached to the holding member 12, etc.

In addition, in the light emitting device 4a, the laser light emitting devices 10 are housed in the light source portion 101a and the wavelength conversion part 11 is housed in the light source portion 101b.

Effects of the Embodiments

According to the embodiments, it is possible to provide a high-brightness light emitting device by using a high-power laser diode and a single crystal phosphor excellent in quantum efficiency at high temperature and thermal quenching characteristics.

EXAMPLE 1

Figure 30:
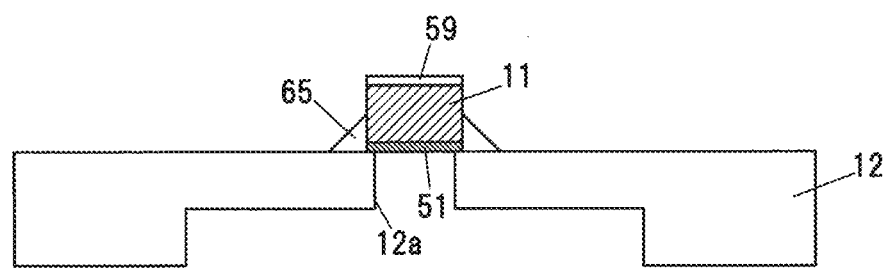
FIG. 30 is a vertical cross-sectional view showing the structure for holding the wavelength conversion part in Example 1.

Irradiance of the irradiation light at which cracks occur on the wavelength conversion part 11 of the holding structure shown in FIG. 30 was examined.

The wavelength conversion part 11 in Example 1 is configured that the antireflection film 59 is formed on the upper surface and the film-shaped dichroic filter 51 transmitting only light of a blue wavelength and reflecting light of other wavelengths is formed on the bottom surface, as shown in FIG. 30. The wavelength conversion part 11 is fixed to the holding member 12 by a highly-reflective silicone-based resin 65 applied to the side surface.

In Example 1, a rectangular parallelepiped-shaped YAG-based single crystal phosphor having a side length of 0.4 mm in a planar view was used as the wavelength conversion part 11, and Al was used as a material of the holding member 12. Then, a laser beam with a power of 0.96 W (at an input current of 1 A) was irradiated on a surface of the wavelength conversion part 11 on the antireflection film 59 side so that the spot area was $2.6 \times 10^{-4}$ mm$^2$.

As a result, it was found that cracks occur at irradiance of not less than 3692 W/mm$^2$. Thus, when irradiance is not less than 3692 W/mm$^2$, it is necessary to reduce power of the laser light emitting device 10 or to increase the spot size by shifting the focal point of the light which is condensed in the vicinity of the surface of the wavelength conversion part 11.

EXAMPLE 2

A relation between a surface area of the wavelength conversion part 11 in contact with the holding member 12 and temperature and a relation between total luminous flux of the wavelength conversion part 11 and the surface area of the wavelength conversion part 11 in contact with the holding member 12 in the holding structure shown in FIG. 5A were examined. In Example 2, a rectangular parallelepiped-shaped YAG-based single crystal phosphor was used as the wavelength conversion part 11.

Figure 31:
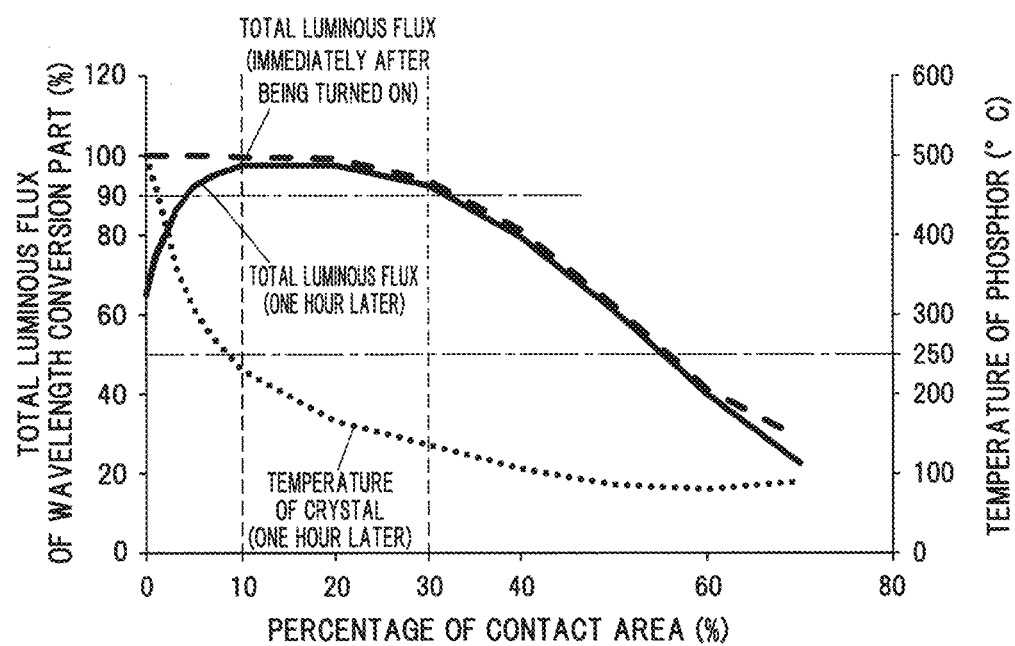
FIG. 31 is a graph showing a relation between percentage of contact area and temperature of the wavelength conversion part and a relation between the percentage of contact area and total luminous flux of the wavelength conversion part in Example 2.

FIG. 31 is a graph showing a relation between percentage of the contact area and temperature of the wavelength conversion part 11 and a relation between the percentage of the contact area and total luminous flux of the wavelength conversion part 11. The percentage of the contact area here is a ratio of the area of the wavelength conversion part 11 in contact with the holding member 12 with respect to the entire surface area of the wavelength conversion part 11.

As shown in FIG. 31, the total luminous flux of the wavelength conversion part 11 can be not less than 90% of its maximum value when the percentage of the contact area is adjusted to not more than 30%. Meanwhile, when the percentage of the contact area is adjusted to not less than 10%, the temperature can be not more than 250° C. at which a decrease in quantum efficiency is small.

EXAMPLE 3

Figure 32A:
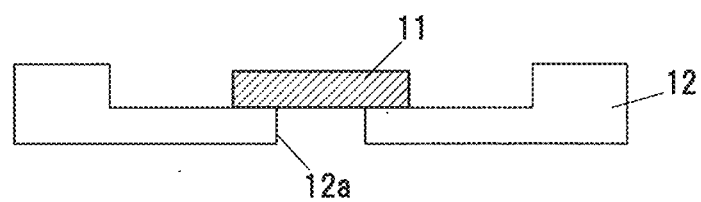
FIG. 32A is a vertical cross-sectional view showing the structure for holding the wavelength conversion part in Example 3.

A relation between irradiance of light irradiated on a single piece of the YAG-based single crystal phosphor constituting the wavelength conversion part 11 and total luminous flux of the single piece of the YAG-based single crystal phosphor in the holding structure shown in FIG. 32A was examined. In Example 3, a disc-shaped YAG-based single crystal phosphor having a diameter of 20 mm was used as the single piece of the YAG-based single crystal phosphor.

Figure 32B:
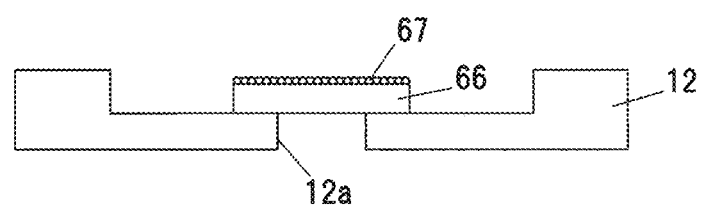
FIG. 32B is a vertical cross-sectional view showing the structure for holding the wavelength conversion part in Comparative Example.

A relation between irradiance of light irradiated on powder phosphor 67 as Comparative Example and total luminous flux of the powder phosphor 67 in the holding structure shown in FIG. 32B was also examined. The powder phosphor 67 is particles of a YAG-based polycrystalline phosphor sintered on a surface of a disc-shaped sapphire plate 66 having a diameter of 20 mm.

Meanwhile, an aggregate of the particles of the YAG-based single crystal phosphor constituting the wavelength conversion part 11 was arranged on the sapphire plate 66 in the holding structure shown in FIG. 32B instead of using the powder phosphor 67, and a relation between irradiance of light irradiated thereon and the total luminous flux was examined. The aggregate of the particles of the YAG-based single crystal phosphor was obtained by crushing a YAG-based single crystal phosphor ingot.

The holding member 12 formed of aluminum was used in the holding structures shown in FIGS. 32A and 32B. Meanwhile, a device having a blue LD with an emission wavelength of 448 nm was used as the laser light emitting device 10 which emits light to be irradiated on the wavelength conversion part 11 and on the powder phosphor 67 in these holding structures.

Figure 33A:
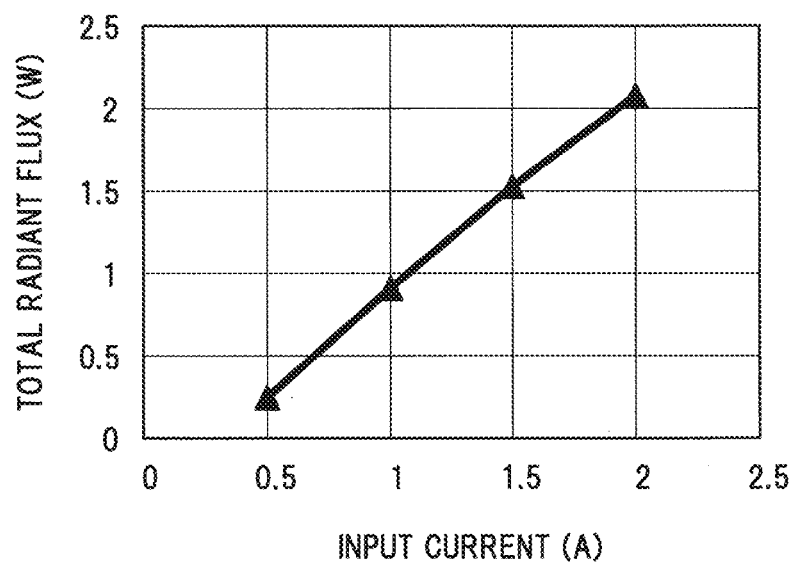
FIG. 33A is a graph showing a relation between input current into a laser light emitting device and total radiant flux in Example 3 and Comparative Example.

FIG. 33A is a graph showing a relation between input current into the laser light emitting device 10 emitting light to be irradiated on these phosphors and total radiant flux.

Figure 33B:
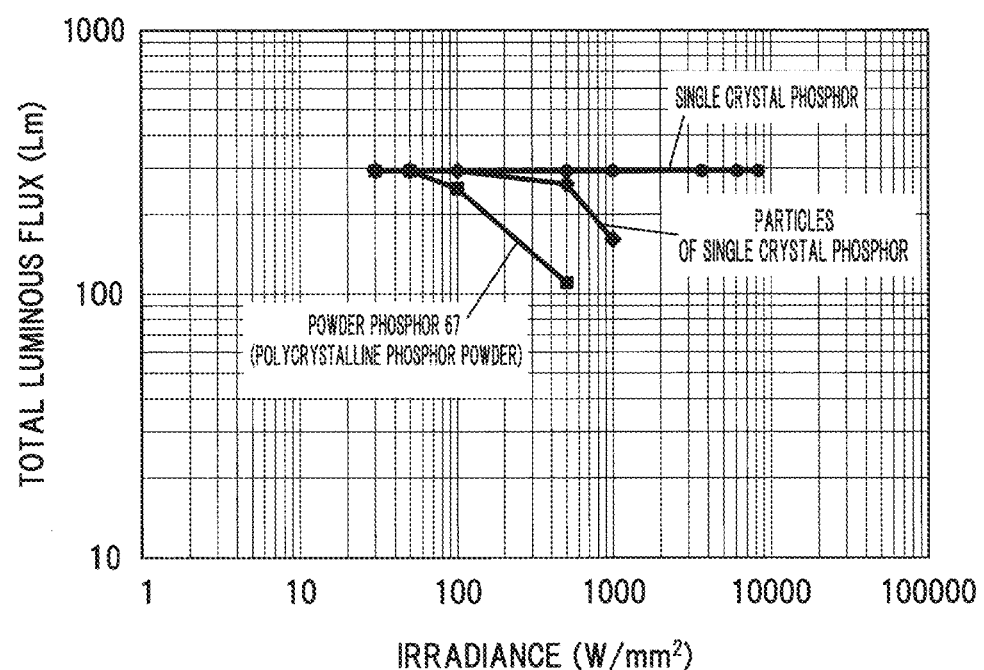
FIG. 33B is a graph showing a relation between irradiance and total luminous flux of light irradiated on a single crystal phosphor in Example 3 and a relation between irradiance and total luminous flux of light irradiated on powder phosphor in Comparative Example.

FIG. 33B is a graph showing a relation between irradiance and total luminous flux of light irradiated on the single piece of the YAG-based single crystal phosphor and the aggregate of the particles of the YAG-based single crystal phosphor constituting the wavelength conversion part 11 in Example 3 and a relation between irradiance and total luminous flux of light irradiated on powder phosphor 67 in Comparative Example.

In the evaluation of FIG. 33B, the spot area on the irradiated surface (a surface on the lower side in FIGS. 32A and 32B) of the wavelength conversion part 11 and the powder phosphor 67 was changed in the state that an input current into the laser light emitting device 10 was fixed to 2A (total radiant flux of 2.074 W), thereby changing irradiance. For example, the spot area at irradiance of 6104 W/mm$^2$ is 0.00034 mm$^2$, and the spot area at irradiance of 8296 W/mm$^2$ is 0.00025 mm$^2$.

Based on FIG. 33B, when irradiance is increased, the total luminous flux of the powder phosphor 67 starts to decrease once the irradiance reached about 100 W/mm$^2$, and the total luminous flux of the aggregate of the particles of the YAG-based single crystal phosphor starts to decrease once the irradiance reached about 500 W/mm$^2$. Meanwhile, the single piece of the YAG-based single crystal phosphor does not exhibit any decrease in the total luminous flux even when the irradiance reached about 10000 W/mm$^2$. This result shows that thermal quenching is less likely to occur in the aggregate of the particles of the YAG-based single crystal phosphor than in the powder phosphor 67, and thermal quenching is further less likely to occur in the single piece of the YAG-based single crystal phosphor.

EXAMPLE 4

A relation between irradiance of light irradiated on the wavelength conversion part 11 and illuminance of light extracted from the wavelength conversion part 11 in the holding structure shown in FIG. 7 was examined. In Example 4, a rectangular parallelepiped-shaped YAG-based single crystal phosphor having a side length of 0.4 mm in the planar view and a thickness of 0.3 mm was used as the wavelength conversion part 11.

A device having a blue LD with an emission wavelength of 448 nm was used as the laser light emitting device 10 which emits light to be irradiated on the wavelength conversion part 11 in Example 3.

Figure 34A:
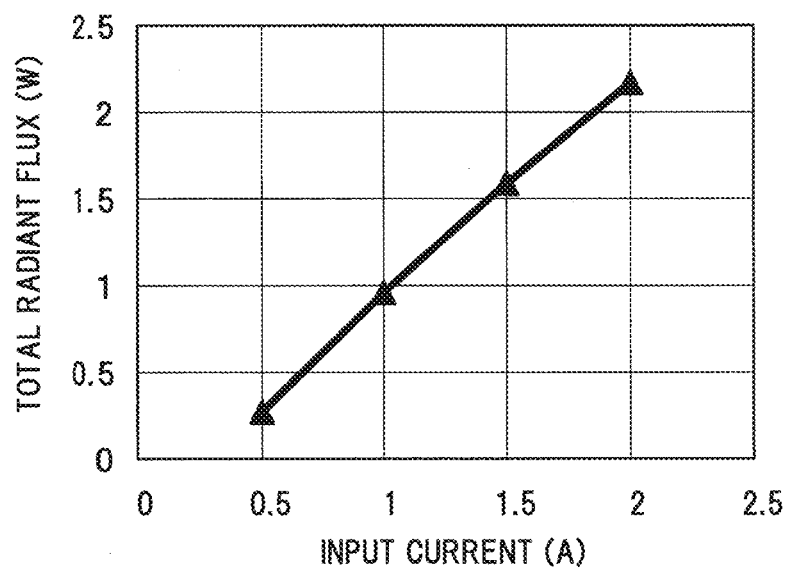
FIG. 34A is a graph showing a relation between input current into the laser light emitting device and total radiant flux in Example 4.

FIG. 34A is a graph showing a relation between input current into a laser light emitting device 10 and total radiant flux in Example 4.

Figure 34B:
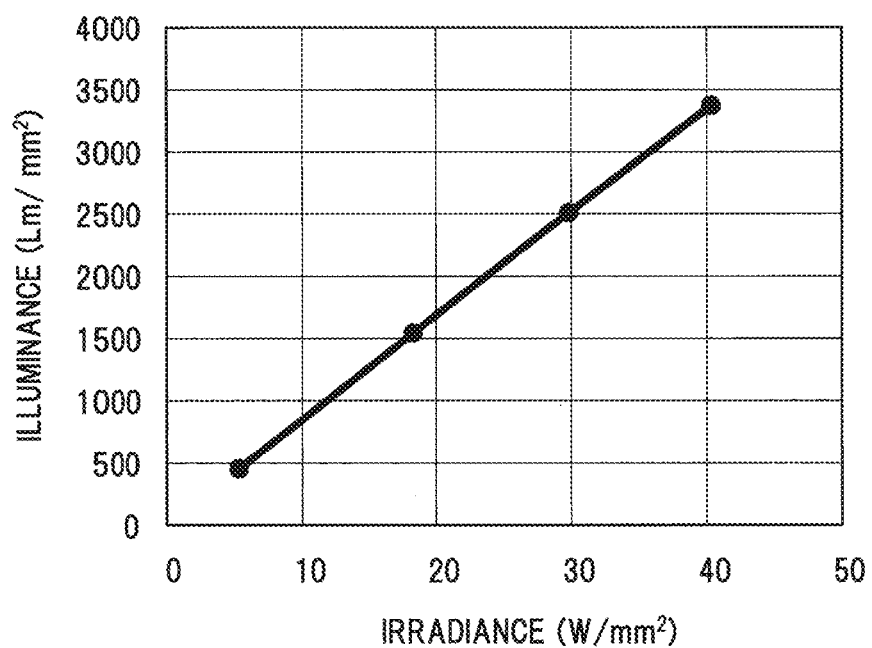
FIG. 34B is a graph showing a relation between irradiance of light irradiated on the wavelength conversion part and illuminance of light extracted from the wavelength conversion part in Example 4.

FIG. 34B is a graph showing a relation between irradiance of light irradiated on the wavelength conversion part 11 and illuminance of light extracted from the wavelength conversion part 11 in Example 4.

In the evaluation of FIG. 34B, the spot area on the irradiated surface (a surface on the lower side in FIG. 34B) of the wavelength conversion part 11 and the powder phosphor 67 was changed in the state that an input current into the laser light emitting device 10 was fixed to 2A, thereby changing irradiance. For example, at irradiance of 40.32 W/mm$^2$, the spot area is 0.034 mm$^2$ and the x and y chromaticity coordinates are 0.3471 and 0.4158.

The illuminance of light extracted from the wavelength conversion part 11 shown in FIG. 34B is 20 to 30% higher than when the band-pass filter 52 is not provided.

EXAMPLE 5

In Example 5, a relation between the spot area of the light emitted from the laser light emitting device 10 on the irradiated surface of the wavelength conversion part 11 and color unevenness of light extracted from the wavelength conversion part 11 was simulated.

In this simulation, power and emission wavelength of the LD used for irradiating light on the wavelength conversion part 11 were respectively 2.27 W and 450 nm, and a YAG-based single crystal phosphor having a thickness of 0.3 mm was used as the wavelength conversion part 11. Then, color distribution of light on a square light-receiving surface with a side length of 200 mm, which was located 29.6 mm away from the wavelength conversion part 11, was simulated.

Figure 35A:
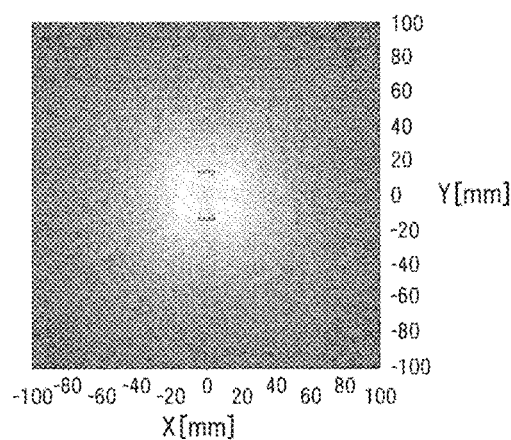
FIG. 35A is a diagram obtained by simulation in Example 5 and showing a relation between the spot area of irradiation light on the irradiated surface of the wavelength conversion part and color unevenness of light extracted from the wavelength conversion part.
Figure 35B:
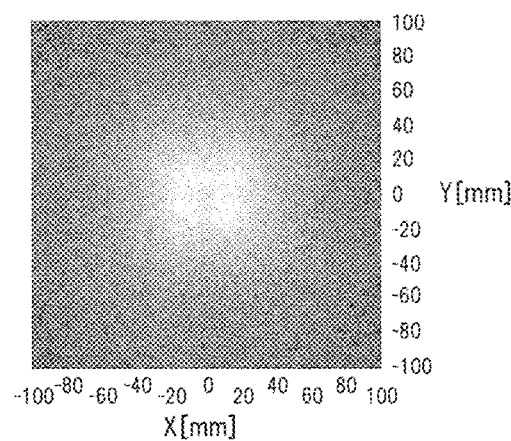
FIG. 35B is a diagram obtained by simulation in Example 5 and showing a relation between the spot area of irradiation light on the irradiated surface of the wavelength conversion part and color unevenness of light extracted from the wavelength conversion part.

FIGS. 35A and 35B show color distribution of light on the light-receiving surface respectively when the spot area on the irradiated surface of the wavelength conversion part 11 is 0.048 mm$^2$ and 0.060 mm$^2$. On the light-receiving surface shown in FIG. 35A, blue part of the light is missing and the color is uneven. On the other hand, on the light-receiving surface shown in FIG. 35B, missing of the blue part of the light is not observed and the color is even.

As a result of the simulation in Example 5, color unevenness was suppressed by adjusting the spot area on the irradiated surface of the wavelength conversion part 11 to not less than 0.060 mm$^2$. This confirmed that increasing the spot area by shifting the focal point of the light allows the unevenness of emission color to be suppressed. The threshold of the spot area allowing suppression of color unevenness depends on, e.g., the size of the wavelength conversion part 11 or the output power of the LD.

Although the embodiments and Examples of the invention have been described, the invention is not intended to be limited to the embodiments and Examples, and the various kinds of modifications can be implemented without departing from the gist of the invention. In addition, the constituent elements in the embodiments and Examples can be arbitrarily combined without departing from the gist of the invention.

In addition, the invention according to claims is not to be limited to the embodiments and Examples described above. Further, it should be noted that all combinations of the features described in the embodiments are not necessary to solve the problem of the invention.

INDUSTRIAL APPLICABILITY

Provided is a high-brightness light emitting device which emits white light by means of a combination of a laser diode and a phosphor.

REFERENCE SIGNS LIST 1, 1a, 2, 2a, 2b, 3, 3a, 4, 4a LIGHT EMITTING DEVICE
10 LASER LIGHT EMITTING DEVICE
11 WAVELENGTH CONVERSION PART
13a, 13b LENS
21 OPTICAL FIBER

The invention claimed is:

1. A light emitting device, comprising:
a laser diode that emits a blue light;
a wavelength conversion part that absorbs a part of light emitted from the laser diode and converts a wavelength thereof; and
a lens that condenses light emitted from the laser diode,
wherein the wavelength conversion part comprises a YAG-based single crystal phosphor,
wherein irradiance of light emitted from the laser diode and irradiated on the wavelength conversion part is not less than 80 W/mm$^2$, and
wherein light condensed by the lens is irradiated on the wavelength conversion part.

2. The light emitting device according to claim 1, wherein the wavelength conversion part comprises a single piece of the single crystal phosphor.

3. The light emitting device according to claim 1, wherein the wavelength conversion part comprises a plurality of particles of the single crystal phosphor that are bound to each other by a binder.

4. The light emitting device according to claim 1, wherein the wavelength conversion part is held by a heat dissipation member that comprises aluminum nitride, alumina, SiN, Cu or Al and dissipates heat generated from the wavelength conversion part.

5. A light emitting device, comprising:
a laser diode that emits a blue light;
a wavelength conversion part that absorbs a part of light emitted from the laser diode and converts a wavelength thereof; and
an optical waveguide that transmits light emitted from the laser diode,
wherein the wavelength conversion part comprises a YAG-based single crystal phosphor,
wherein irradiance of light emitted from the laser diode and irradiated on the wavelength conversion part is not less than 80 W/mm$^2$, and
wherein light transmitted through the optical waveguide is irradiated on the wavelength conversion part.

6. The light emitting device according to claim 5, wherein the wavelength conversion part comprises a single piece of the single crystal phosphor.

7. The light emitting device according to claim 5, wherein the wavelength conversion part comprises a plurality of particles of the single crystal phosphor that are bound to each other by a binder.

8. The light emitting device according to claim 5, wherein the wavelength conversion part is held by a heat dissipation member that comprises aluminum nitride, alumina, SiN, Cu or Al and dissipates heat generated from the wavelength conversion part.

9. A light emitting device, comprising:
a laser diode that emits a blue light; and
a wavelength conversion part that absorbs a part of light emitted from the laser diode and converts a wavelength thereof,
wherein the wavelength conversion part comprises a YAG-based single crystal phosphor,
wherein irradiance of light emitted from the laser diode and irradiated on the wavelength conversion part is not less than 80 W/mm$^2$, and
wherein the single crystal phosphor has a composition represented by a compositional formula $(Y_{1-a-b}Lu_aCe_b)_{3+c}Al_{5-c}O_{12}(0 \le a \le 0.9994, 0.0002 \le b \le 0.0067, -0.016 \le c \le 0.315)$.

10. The light emitting device according to claim 9, wherein the wavelength conversion part comprises a single piece of the single crystal phosphor.

11. The light emitting device according to claim 9, wherein the wavelength conversion part comprises a plurality of particles of the single crystal phosphor that are bound to each other by a binder.

12. The light emitting device according to claim 9, wherein the wavelength conversion part is held by a heat dissipation member that comprises aluminum nitride, alumina, SiN, Cu or Al and dissipates heat generated from the wavelength conversion part.

* * * * *